(12) United States Patent
Hsieh et al.

(10) Patent No.: US 12,033,912 B2
(45) Date of Patent: Jul. 9, 2024

(54) PACKAGE STRUCTURE AND MANUFACTURING METHOD THEREOF

(71) Applicant: Taiwan Semiconductor Manufacturing Company, Ltd., Hsinchu (TW)

(72) Inventors: Ping-Yin Hsieh, Hsinchu (TW); Li-Hui Cheng, New Taipei (TW); Pu Wang, Hsinchu (TW); Szu-Wei Lu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 212 days.

(21) Appl. No.: 17/401,296

(22) Filed: Aug. 12, 2021

(65) Prior Publication Data

US 2023/0048302 A1  Feb. 16, 2023

(51) Int. Cl.
*H01L 23/42* (2006.01)
*H01L 21/48* (2006.01)
(Continued)

(52) U.S. Cl.
CPC ...... *H01L 23/3675* (2013.01); *H01L 21/4853* (2013.01); *H01L 21/486* (2013.01);
(Continued)

(58) Field of Classification Search
CPC ....... H01L 21/4882; H01L 2225/06589; H01L 23/3675; H01L 23/10; H01L 23/42; H01L 23/367; H01L 23/373
See application file for complete search history.

(56) References Cited

U.S. PATENT DOCUMENTS 8,993,380 B2  3/2015 Hou et al.
9,281,254 B2  3/2016 Yu et al.
(Continued)

FOREIGN PATENT DOCUMENTS

TW  202125655  7/2021

OTHER PUBLICATIONS

"Office Action of Taiwan Counterpart Application", dated Jan. 30, 2023, p. 1-p. 4.

*Primary Examiner* — Evan G Clinton
(74) *Attorney, Agent, or Firm* — JCIPRNET

(57) ABSTRACT

A package structure includes first/second/third package components, a thermal interface material (TIM) structure overlying the first package component opposite to the second package component, and a heat dissipating component disposed on the third package component and thermally coupled to the first package component through the TIM structure. The first package component includes semiconductor dies and an insulating encapsulation encapsulating the semiconductor dies, the second package component is interposed between the first and third package components, and the semiconductor dies are electrically coupled to the third package component via the second package component. The TIM structure includes a dielectric dam and thermally conductive members including a conductive material, disposed within areas confined by the dielectric dam, and overlying the semiconductor dies. A manufacturing method of a package structure is also provided.

20 Claims, 22 Drawing Sheets

(51) Int. Cl.
  *H01L 21/56*    (2006.01)
  *H01L 23/00*    (2006.01)
  *H01L 23/31*    (2006.01)
  *H01L 23/367*   (2006.01)
  *H01L 23/498*   (2006.01)
  *H01L 25/00*    (2006.01)
  *H01L 25/065*   (2023.01)

(52) U.S. Cl.
  CPC ........ *H01L 21/4882* (2013.01); *H01L 21/565* (2013.01); *H01L 23/3128* (2013.01); *H01L 23/367* (2013.01); *H01L 23/42* (2013.01); *H01L 23/49827* (2013.01); *H01L 24/16* (2013.01); *H01L 25/0655* (2013.01); *H01L 25/50* (2013.01); *H01L 2224/16235* (2013.01); *H01L 2924/1715* (2013.01)

(56) References Cited

U.S. PATENT DOCUMENTS

| | | |
|---|---|---|
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |
| 9,735,131 B2 | 8/2017 | Su et al. |
| 2004/0262766 A1* | 12/2004 | Houle ............... H01L 23/04 257/E23.087 |
| 2021/0066155 A1* | 3/2021 | Nofen ............... H01L 25/18 |
| 2021/0202455 A1* | 7/2021 | Tsai ............... H01L 25/0655 |

* cited by examiner

PACKAGE STRUCTURE AND MANUFACTURING METHOD THEREOF

BACKGROUND

As electronic products are continuously miniaturized, heat dissipation of a package structure has become an important issue for packaging technology. In some embodiments, the thermal interface material may be disposed between the back side of the semiconductor die and the heat spreader. In such arrangement, damage may occur depending of the type of thermal interface material used. For example, thermos-mechanical stresses may arise due to differences in the coefficients of thermal expansion between the heat spreader, the semiconductor die, and the thermal interface material. In addition, cracks may occur in the rigid type thermal interface material itself or in the semiconductor die, and the grease type of thermal interface material may exhibit degradation of thermal performance during temperature cycling. As a result, there is continuous effort in developing new mechanisms of forming package structures with better reliability and performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
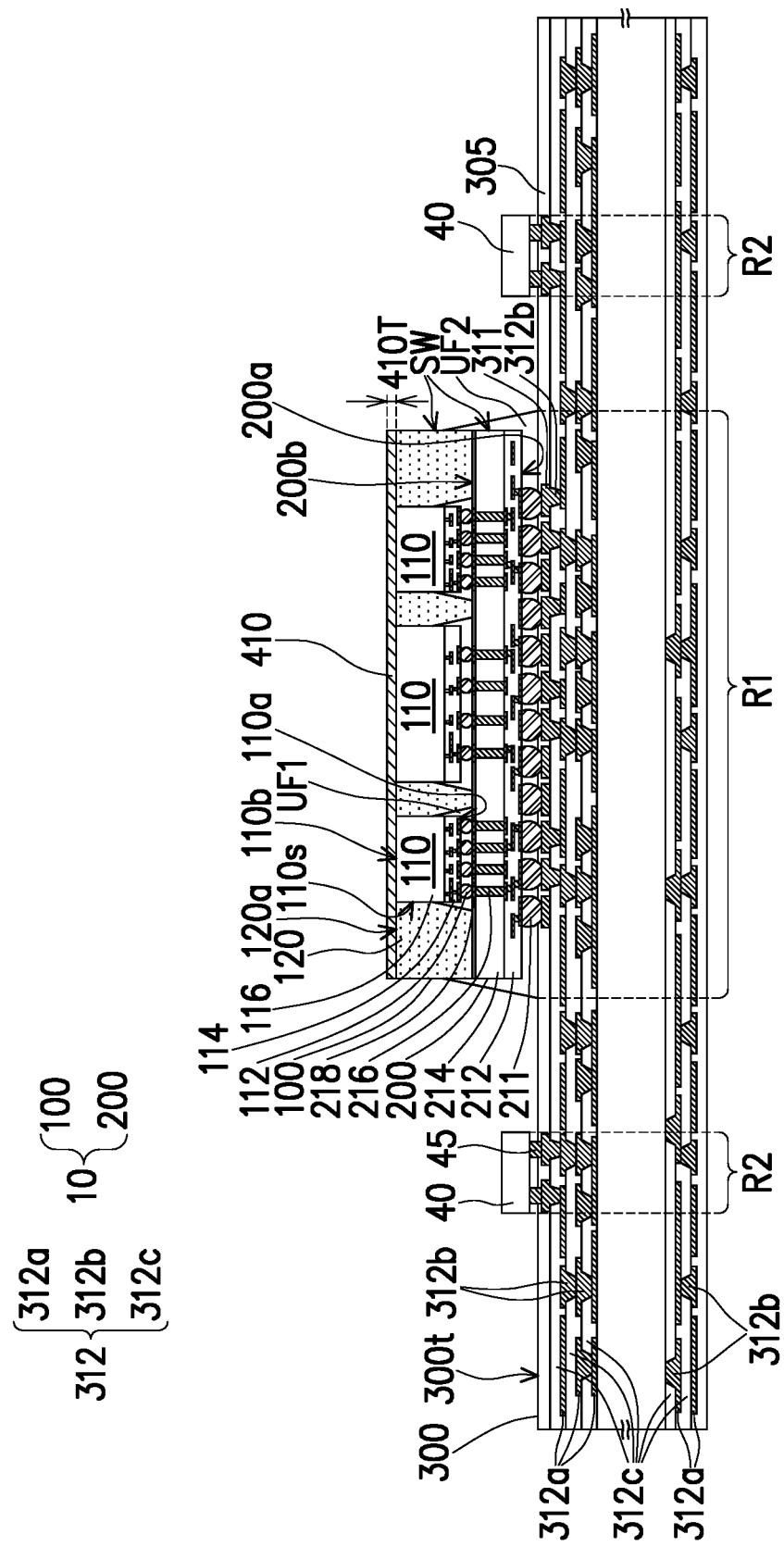
FIGS. 1A-1E are schematic cross-sectional views of various stages of manufacturing a package structure in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 1B:
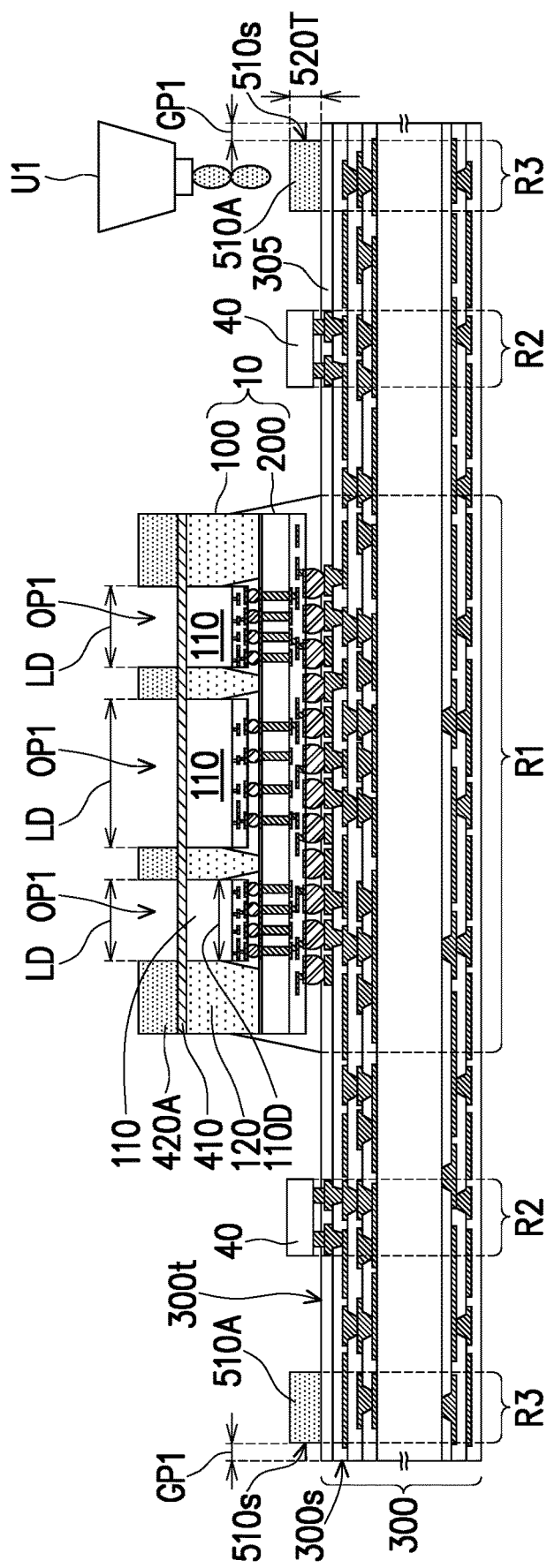
Figure 1C:
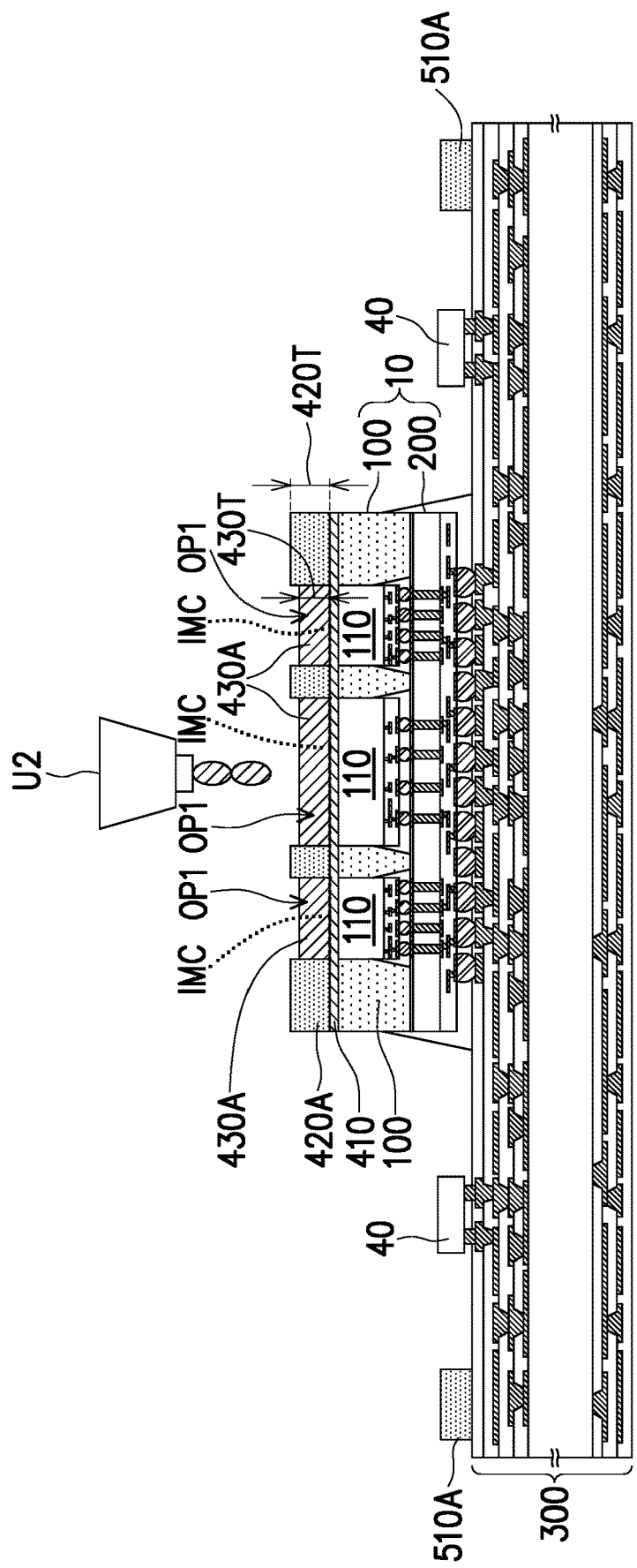
Figure 1D:
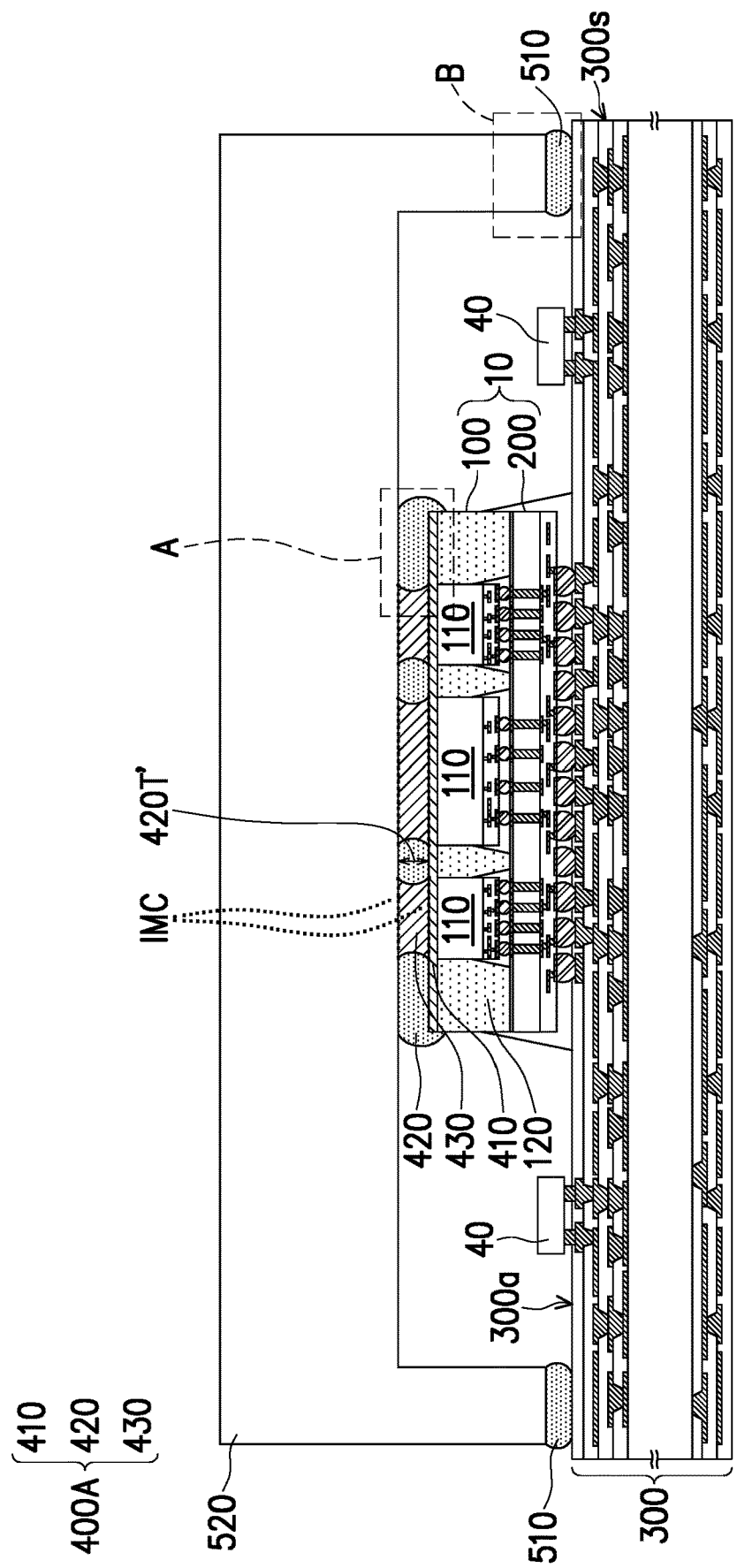
Figure 1E:
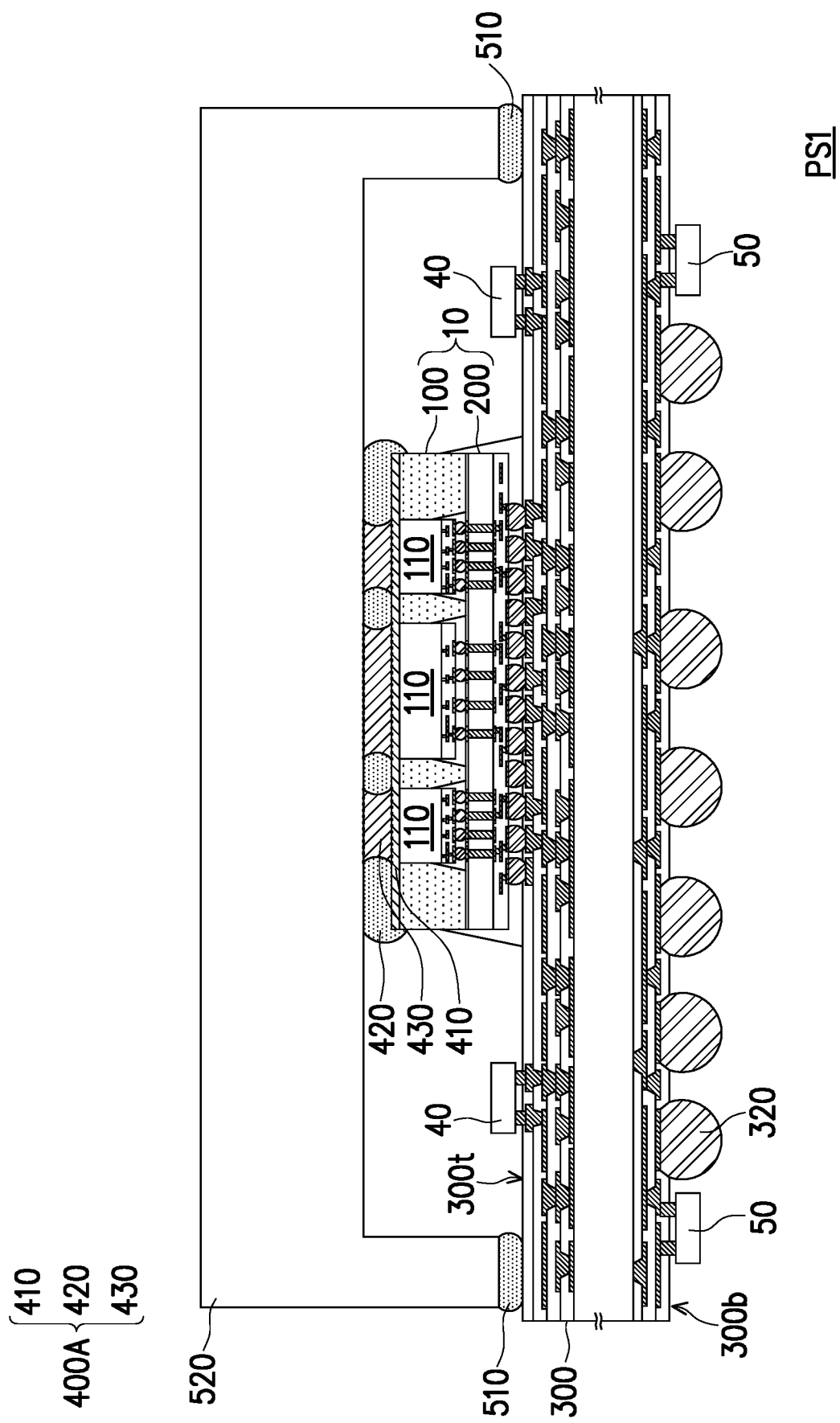
Figure 2A:
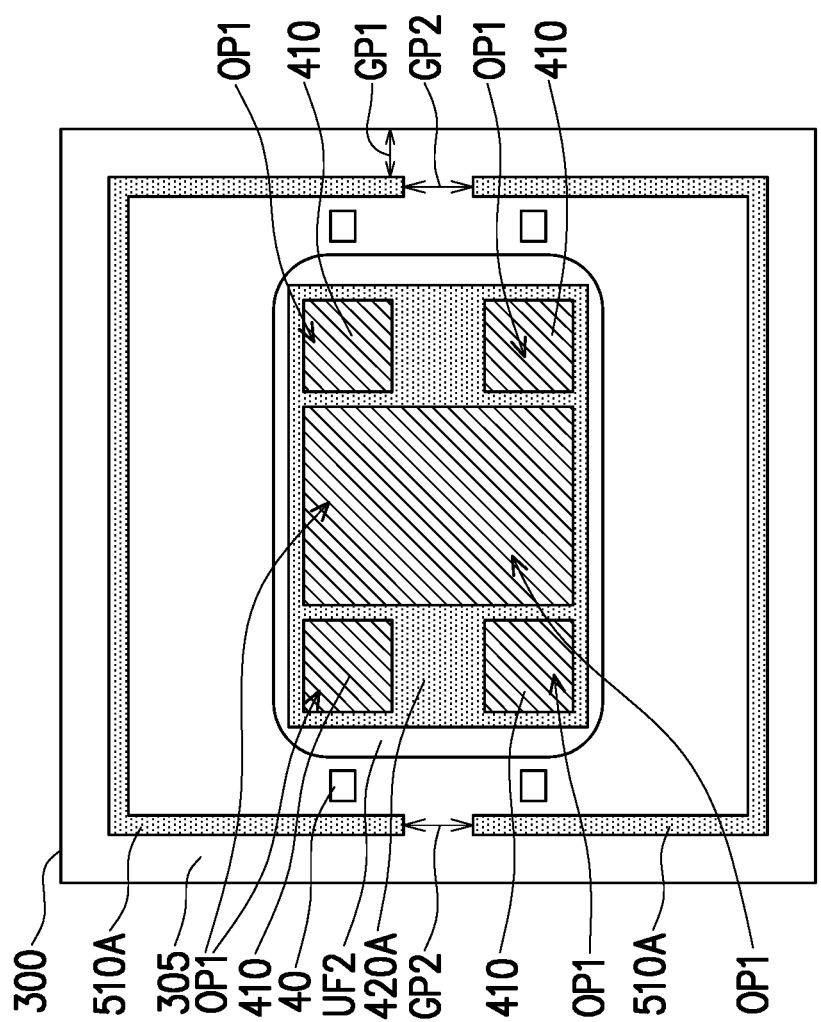
FIG. 2A is a schematic top-down view of a structure shown in FIG. 1B in accordance with some embodiments.
Figure 2B:
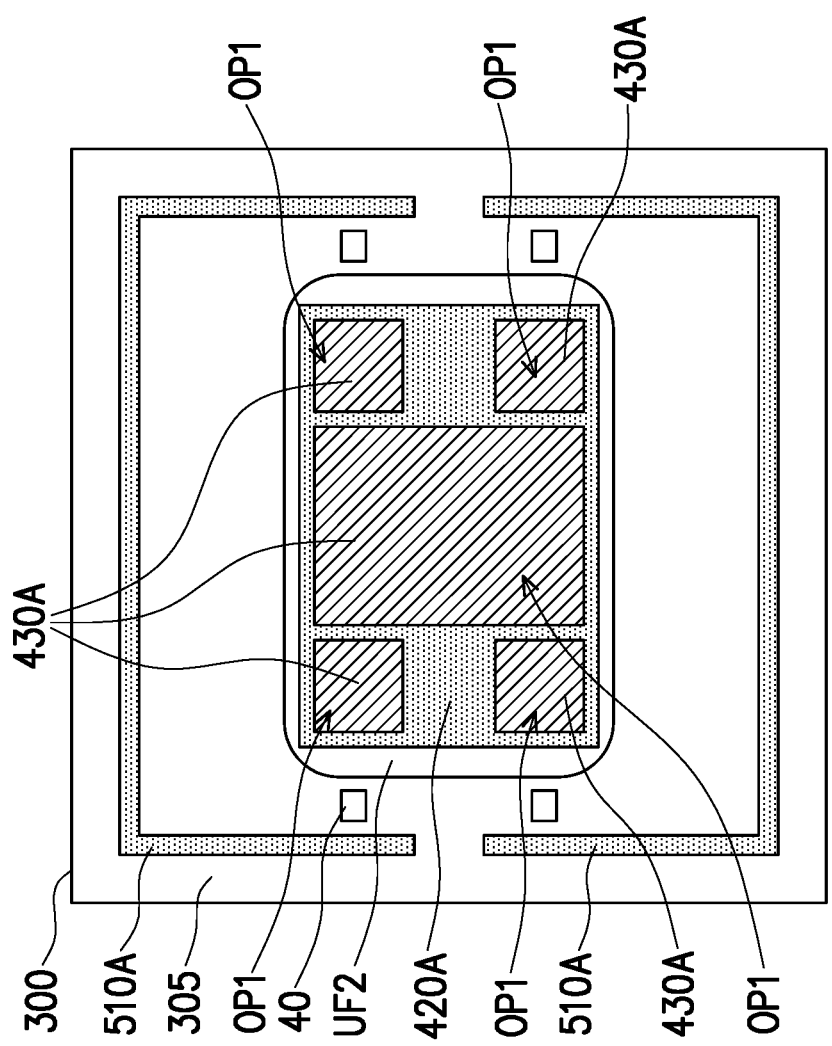
FIG. 2B is a schematic top-down view of a structure shown in FIG. 1C in accordance with some embodiments.
Figure 2C:
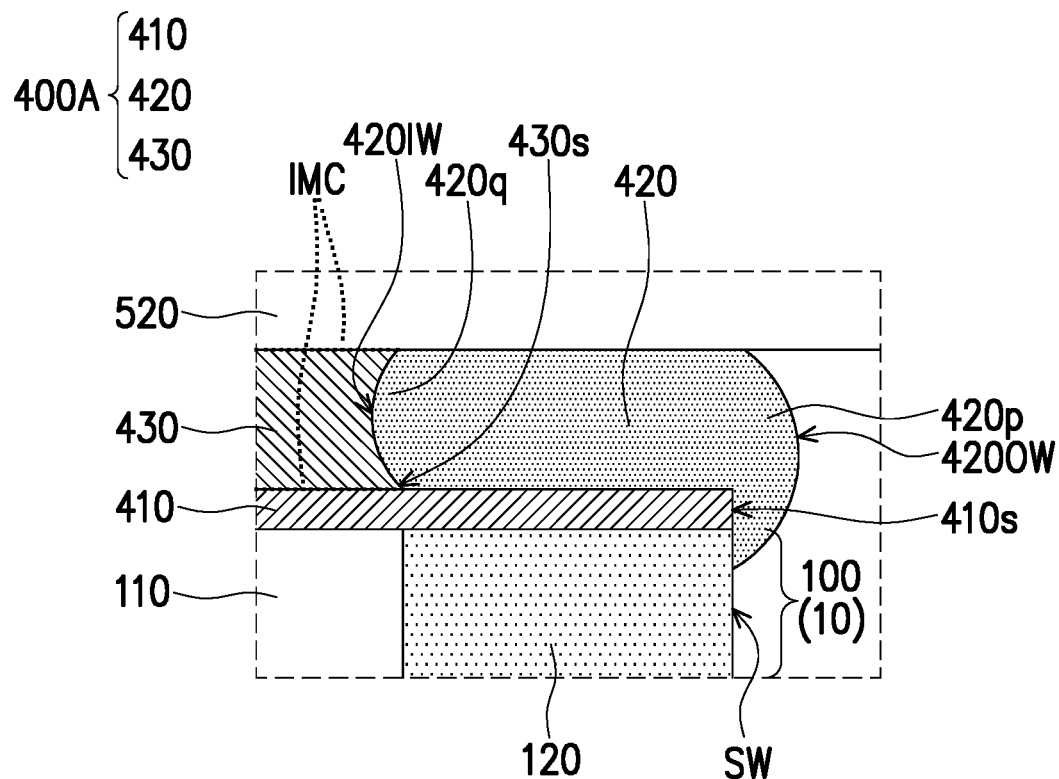
FIG. 2C is a schematic and enlarged view of a dashed box A shown in FIG. 1D in accordance with some embodiments.
Figure 2D:
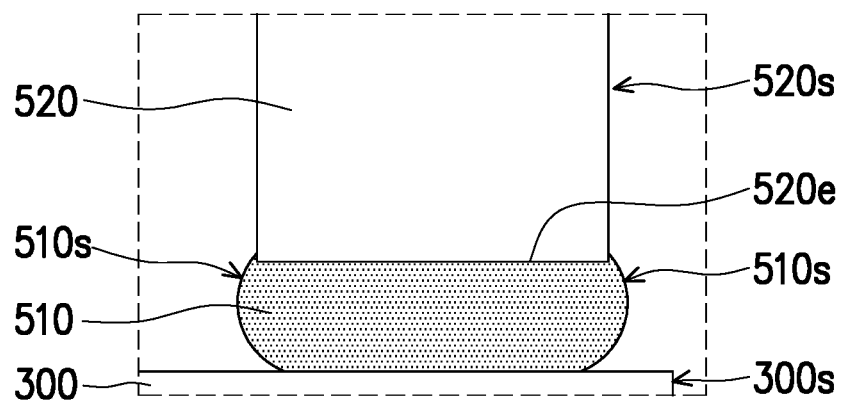
FIG. 2D is a schematic and enlarged view of a dashed box B shown in FIG. 1D in accordance with some embodiments.

FIGS. 1A-1E are schematic cross-sectional views of various stages of manufacturing a package structure in accordance with some embodiments, FIG. 2A is a schematic top-down view of a structure shown in FIG. 1B in accordance with some embodiments, FIG. 2B is a schematic top-down view of a structure shown in FIG. 1C in accordance with some embodiments, FIG. 2C is a schematic and enlarged view of a dashed box A shown in FIG. 1D in accordance with some embodiments, and FIG. 2D is a schematic and enlarged view of a dashed box B shown in FIG. 1D in accordance with some embodiments.

Referring to FIG. 1A, a first package component 100 may be disposed on a second package component 200, and a stack of the first package component 100 and the second package component 200 may be mounted on a third package component 300 with the second package component 200 interposed between the first package component 100 and the third package component 300. In some embodiments, the first package component 100 and the second package component 200 may be collectively viewed as a device package 10. For example, the first package component 100 includes a plurality of semiconductor dies 110 disposed side by side and encapsulated by an insulating encapsulation 120. In some embodiments, the semiconductor dies 110 are electrically coupled to one another through the second package component 200.

The respective semiconductor die 110 may include a first side 110a facing the second package component 200, a second side 110b opposite to the first side 110a, and a sidewall 110s connected to the first side 110a and the second side 110b. In some embodiments, the semiconductor die 110 includes die connectors 112 (e.g., micro-bumps, metal pillars with or without caps, controlled collapse chip connection (C4) bumps, or the like) distributed at the first side 110a for electrically connecting the second package component 200. The respective semiconductor die 110 may (or may not) include an interconnecting layer 114 for connecting the active/passive devices (not shown) formed on/in the semiconductor substrate 116 to the die connectors 112. The semiconductor substrate 116 may refer to a semiconductor material(s) including, but not limited to, bulk silicon, a semiconductor wafer, a silicon germanium substrate, silicon-on-insulator (SOI) substrate, or the like. Other semiconductor materials including group III, group IV, and group V elements may be used. In some embodiments, the interconnecting layer 114 includes a plurality of dielectric sublayers, metal lines formed in the dielectric sublayers, and conductive vias formed between overlying and underlying metal lines. It is noted that the configuration and the number of the semiconductor dies 110 shown herein is merely for illustrative purposes, and any other configuration and number of the semiconductor dies may be employed depending on product requirements.

With continued reference to FIG. 1A, in some embodiments, the respective semiconductor die 110 may have a single function (e.g., a logic die, a processor die (e.g., a central processing unit (CPU) die, a graphics processing unit (GPU) die, an application-specific integrated circuit (ASIC) die, etc.), a memory die (e.g., a dynamic random-access memory (DRAM) die, a static random-access memory (SRAM) die, a stacked memory module, a high-bandwidth memory (HBM) die, etc.), a RF die, a mixed signal die, a I/O die, combinations thereof, and/or the like). For example, the semiconductor dies 110 may be formed in a device wafer (not shown), which includes different die regions that are singulated to form a plurality of device dies. After the singulation, the semiconductor dies 110 are mounted on the predetermined locations of the second package component 200. In some embodiments, the semiconductor dies 110 may be of different sizes (e.g., footprint areas) and have different functions. For example, at least one of the semiconductor dies 110 may be formed as a die stack having multiple functions (e.g., a system-on-chip or the like). For example, the semiconductor die 110 includes an interface module which bridges the processor module to memory module and translates commands therebetween. Alternatively, the semiconductor dies 110 may be of the same/similar dimension(s). Other types of semiconductor dies may be used depending on product requirements.

In some embodiments, the insulating encapsulation 120 extends along at least the sidewalls 110s of the semiconductor dies 110 for protection. The insulating encapsulation 120 may be or may include molding compound, epoxy resin, molding underfill, and/or the like, and may be applied by compression molding, transfer molding, or the like. For example, the insulating encapsulation 120 is formed over the second package component 200, and the semiconductor dies 110 may be buried or covered by the insulating encapsulation 120. In some embodiments, the insulating encapsulation 120 is thinned to expose the rear surfaces (e.g., the second sides 110b) of the semiconductor dies 110. The thinning process may be performed by a chemical-mechanical polishing (CMP) process, a grinding process, an etching process, a combination thereof, and/or the like. In some embodiments, after the thinning process, the upper surface 120a of the insulating encapsulation 120 and the rear surfaces (e.g., the second sides 110b) of the semiconductor dies 110 may be substantially leveled.

In some embodiments, an underfill layer UF1 is formed between the gap of the respective semiconductor die 110 and the second package component 200 to laterally cover the electrical connections of the die connectors 116 and the second package component 200. In some embodiments, a sufficient amount of the underfill material is dispensed between the second package component 200 and the semiconductor dies 110 that have been flip-chip mounted to the second package component 200, and a portion of the underfill layer UF1 may climb up to at least partially cover the sidewalls 110s of the semiconductor dies 110. The insulating encapsulation 120 may be formed after the formation of the underfill layer UF1, so that the rest portions of the sidewalls 110s of the semiconductor dies 110 that are unmasked by the underfill layer UF1 may be covered by the insulating encapsulation 120. Alternatively, the underfill layer UF1 is omitted, and the gaps between the semiconductor dies 110 and the second package component 200 may be covered by the insulating encapsulation 120.

With continued reference to FIG. 1A, a conductive layer 410 may be formed on the rear surfaces (e.g., the second sides 110b) of the semiconductor dies 110. In some embodiments, the conductive layer 410 is formed on the semiconductor dies 110 and extends to cover the upper surface 120a of the insulating encapsulation 120. The conductive layer 410 may be referred to as a backside metal layer according to some embodiments. In some embodiments, the conductive layer 410 is formed on the first package component 100 prior to a singulation process performed to separate device packages 10 from one another. Alternatively, the conductive layer 410 is formed after the singulation of the device packages 10. The conductive layer 410 may include titanium (Ti), copper (Cu), nickel (Ni), vanadium (V), Al, cobalt (Co), gold (Au), silver (Ag), stainless steel, or other suitable conductive materials having relatively high thermal conductivities. The conductive layer 410 may be or may include one or more layers of conductive material(s). For example, the conductive layer 410 optionally includes a seed material sublayer (e.g., titanium/copper thin layer) that permits the adhesion of the subsequently deposited conductive material thereon. In some embodiments, the conductive layer 410 is formed by chemical-vapor deposition (CVD), plasma enhanced CVD (PECVD), physical vapor deposition (PVD), atomic layer deposition (ALD), electroplating, evaporation, sputtering and/or other suitable process. For example, a thickness 410T of the conductive layer 410 ranges between about 100 angstroms (Å) and about 5 microns (μm). Alternatively, the conductive layer 410 may be formed as a sporadic conductive pattern overlying the semiconductor dies 110, or the conductive layer 410 may be omitted as will be described later in other embodiments.

With continued reference to FIG. 1A, the second package component 200 may (or may not) include active devices and/or passive devices. In some embodiments, the second package component 200 acts as an interposer. For example, the second package component 200 includes an interconnect structure 212 on a first side 200a of the second package component 200. The interconnect structure 212 may include a plurality of dielectric layers, conductive patterns embedded in the dielectric layers, and conductive vias interconnecting two vertically adjacent levels of the conductive patterns. In some other embodiments, the interconnect structure is formed at a second side 200b opposite to the first side 200a for electrically connecting the semiconductor dies 110. Alternatively, the interconnect structures formed at the first side 200a and the second side 200b. In some embodiments, the second package component 200 includes a plurality of conductive terminals 211 distributed at the first side 200a and connecting the interconnect structure 212 and the third package component 300. The conductive terminals 211 may be or may include controlled collapse chip connection (C4) bumps, metal pillars, electroless nickel-electroless palladium-immersion gold technique (ENEPIG) formed bumps, solder balls, ball-grid-array (BGA) connectors, and/or the like.

In some embodiments, the interconnect structure 212 is formed on a semiconductor substrate 214. The semiconductor substrate 214 may have a material similar to the material of the semiconductor substrate 116 or may be formed of other suitable material(s). The second package component 200 may include a plurality of conductive through-vias 216 penetrating through the semiconductor substrate 214 to provide vertical and electrical connections between two opposing sides of the semiconductor substrate 214. For example, the conductive through-vias 216 are electrically connected to the conductive patterns of the interconnect structure 212 and extending toward the first package component 100 to be connected to the conductive patterns 218 (e.g., contact pads) at the second side 200b of the second package component 200. The die connectors 112 of the first package component 110 may be in physical and electrical contact with one side of the conductive patterns 218, and the conductive through-vias 216 are connected to the other side of the conductive patterns 218. The second package component 200 optionally includes a dielectric layer formed on the semiconductor substrate 214 to cover the conductive patterns 218 (e.g., contact pads) for protection, and the insulating encapsulation 120 (and the underfill layer UF1, if exist) may be formed on the dielectric layer.

In some other embodiments, the second package component 200 is formed as a fan-out redistribution structure, where the semiconductor substrate 214 and the conductive through-vias 216 may be omitted or may be replaced with other interconnecting layer(s). Under this scenario, the first package component and the second package component are collectively viewed as an integrated fan-out package. It is noted that the second package component 200 illustrated herein is merely for illustrative purposes, and additional or fewer element(s) may be arranged in the second package component 200. In some embodiments, the second package component 200 and the first package component 100 disposed thereon are formed in wafer form and then singulated by a singulation process, thereby separating a stack of the first package component and the second package component into a plurality of device packages 10. In this manner, the outer sidewall of the first package component 100 is substantially leveled with the outer sidewall of the second package component 200. For example, the resulting device packages 10 including the first package component 100 the second package component 200 and after singulation have edges formed by coterminous sidewalls SW of the interconnect structure 212, the semiconductor substrate 214, and the insulating encapsulation 120.

Still referring to FIG. 1A, the third package component 300 may be in physical and electrical contact with the conductive terminals 211 of the second package component 200. For example, after the singulation, the resulting device package 10 may be mounted onto a top side 300t of the third package component 300 by a reflow process or other suitable technique(s). In some embodiments, the underfill layer UF2 is formed between the gap of the second package component 200 and the third package component 300 to surround the conductive terminals 211 for protection. In some embodiments, a sufficient amount of underfill material is dispensed, and a portion of the underfill layer UF2 may climb up to at least partially cover the sidewalls SW of the second package component 200 or even the first package component 100. Alternatively, the underfill layer UF2 is omitted.

In some embodiments, the third package component 300 includes contact pads 311 for the conductive terminals 211 landing thereon. A mask layer 305 (e.g., a solder resist layer or the like) is optionally formed to partially cover the contact pads 311 to prevent bridging and protect the underlying conductive patterns. For example, the contact pads 311 are formed on trace layers 312 including conductive patterns 312a (e.g., lines and pads) and conductive vias 312b embedded in dielectric layers 312c. In some embodiments, the third package component 300 is a laminate package substrate, where the conductive patterns are embedded in laminated dielectric layers. In some embodiments, the third package component 300 is a built-up package substrate, which includes a core layer (not shown; e.g., BT resin, FR-4, ceramic, glass, plastic, tape, built-up film, or other supporting materials), conductive patterns built on opposite sides of the core layer, and through-vias penetrating through the core layer to connect the conductive patterns at the opposite sides of the core layer. In some embodiments, the package substrate is a multiple-layered circuit board (e.g., a printed circuit board (PCB)) or other types of substrates depending on product requirements.

Still referring to FIG. 1A, the device package 10 including the second package component 200 and the first package component 100 may be arranged in the first region R1 of the third package component 300. In some embodiments, a fourth package component 40 is bonded to the third package component 300 within the second region R2, where the first region R1 may be surrounded by the second region R2. The fourth package component 40 may be or may include integrated passive devices (IPD), integrated voltage regulators (IVR), active components, and/or the like. In some embodiments, the fourth package component 40 is mounted on the third package component 300 through the device connectors 45 landing on the contact pads 311 of the third package component 300. Other types of the connection between the third and the fourth package components may be used. It is noted that FIG. 1A showing two of the fourth package components 40 is merely for illustrative purposes, and the number and the configuration of the fourth package components 40 construe no limitation in the disclosure.

Referring to FIG. 1B and further referencing FIG. 2A, a first dielectric pattern 420A having openings OP1 may be formed over the first package component 100. In some embodiments, the first dielectric pattern 420A is dispensed onto designated areas of the conductive layer 410 via a dispensing unit U1 (e.g., printer, syringe, pump tool, etc.). The material provided with the dispensing unit U1 may be in such as solid, grease, or gel manner. In some embodiments, the first dielectric pattern 420A is provided as an adhesive film with the openings OP1 and may be formed via a suitable film-attaching process to be physically adhered to the conductive layer 410. The material of the first dielectric pattern 420A may be or may include polymeric material(s) such as polyimide (PI), polybenzoxazole (PBO), an epoxy-based material, a silica-based material, an acrylic-based material, etc. In some embodiments, the first dielectric pattern 420A may be or may include a photosensitive material, a lamination material, or a thermal adhesive material, etc. It is noted that any suitable dielectric material, any suitable method of application, and any suitable thickness may be used for the first dielectric pattern 420A.

The conductive layer 410 may be partially covered by the first dielectric pattern 420A and physically interposed between the insulating encapsulation 120 and the first dielectric pattern 420A. The openings OP1 of the first dielectric pattern 420A may accessibly reveal portions of the conductive layer 410. The openings OP1 may be sized to corresponding to the underlying semiconductor dies 110. In some embodiments, each of the openings OP1 corresponds to one of the semiconductor dies 110. The opening size (e.g., lateral dimension LD) of the respective opening OP1 may correspond to the lateral dimension 110D (e.g., length or width) of the underlying semiconductor die 110. In some embodiments, the lateral dimension LD is substantially equal to the lateral dimension 110D of the underlying semiconductor die 110. Alternatively, the lateral dimension LD of the respective opening OP1 is substantially greater than or less than the lateral dimension 110D of the underlying semiconductor die 110. In other embodiments, the openings OP1 are of the same dimension. Alternatively, the opening sizes may be smaller than the semiconductor dies and/or at least one of the semiconductor dies may correspond to more than one opening.

With continued reference to FIG. 1B, a second dielectric pattern 510A may be formed on the third package component 300. The second dielectric pattern 510A may have a material similar to the material of the first dielectric pattern 420A. For example, the second dielectric pattern 510A includes a thermal adhesive having a viscous gel or liquid material. Other type(s) of adhesive may be used. In some embodiments, the first dielectric pattern 420A and the second dielectric pattern 510A are formed of the same material during the same step via the dispensing unit U1. Alternatively, the first dielectric pattern 420A and the second dielectric pattern 510A are formed of different dielectric materials. The second dielectric pattern 510A may be formed before or after the formation of the first dielectric pattern 420A. The thickness 510T of the second dielectric pattern 510A may be substantially the same as (or different from) the thickness 420T of the first dielectric pattern 420A, which depends on product requirements and construes no limitation in the disclosure.

In some embodiments, the second dielectric pattern 510A is formed on any desired areas of the mask layer 305 of the third package component 300 that permit the adhesion of the subsequently-mounted element thereon. For example, the second dielectric pattern 510A is formed within a third region R3, where the first region R1 may be the central region of the third package component 300, the third region R3 may be the peripheral region of the third package component 300, and the second region R2 may be between the first region R1 and the third region. In some embodiments, the outer sidewall 510s of the second dielectric pattern 510A may be laterally offset from the outer sidewall 300s of the third package component 300 by a lateral distance GP1. The lateral distance GP1 may be non-zero, and any suitable value may be employed depending on the design requirements. The second dielectric pattern 510A may be formed as a ring along a perimeter around the top side 300t of the third package component 300. For example, the device package 10 and the fourth package components 40 may be substantially surrounded by the second dielectric pattern 510A.

In some embodiments, the second dielectric pattern 510A is formed as a discontinuous ring with a gap GP2, as shown in FIG. 2A. For example, the second dielectric pattern 510A has a plurality of sides forming a partial ring, and the ends of the sides may be spaced apart from one another by the gap GP2 for venting during the following lid-attaching step. Alternatively, the second dielectric pattern 510A may be formed as a continuous ring. It is noted that the shape and the configuration of the second dielectric pattern 510A shown FIG. 1B are merely for illustrative purposes and construe no limitation in the disclosure.

Referring to FIG. 1C and further referencing FIG. 2B, a conductive material pattern 430A may be formed within the openings OP1 of the first dielectric pattern 420A to be in contact with the conductive layer 410. The conductive material pattern 430A may be viewed as a metal-containing thermal interface material physically and thermally contacting the conductive layer 410. For example, the conductive layer 410 facilitates in jointing the conductive material pattern 430A to the rear surface (e.g., the second side 110b shown in FIG. 1A) of the respective semiconductor die 110. In some embodiments, the conductive material pattern 430A is solder-containing layer. For example, the conductive material pattern 430A includes silver, copper, tin, metal alloys, combinations thereof, or any suitable material having relatively high thermal conductivities. In some embodiments, the conductive material pattern 430A has a thermal conductivity greater than about 40 W/m·K or even greater than 50 W/m·K. For example, the thermal conductivity of the conductive material pattern 430A ranges between about 50 W/m·K to 250 W/m·K.

The conductive material pattern 430A may include a viscous gel or liquid material (e.g., silver paste or solder paste, and/or the like), and may be formed by a dispensing process via a dispensing unit U2. In some embodiments, the conductive material pattern 430A made of conductive paste (e.g., silver paste, solder paste, etc.) is heated at a temperature and for a time sufficient to sinter the conductive particles into an integral conductive layer. During sintering, the integral conductive layer (e.g., silver layer) bonds to the underlying conductive layer 410. The conductive material pattern 430A may be formed by any suitable deposition process or attaching conductive patterns to the conductive layer 410.

In some embodiments, during the formation of the conductive material pattern 430A, the first dielectric pattern 420A functions as a dam structure that prevents the conductive material pattern 430A from spreading or spilling over. After the formation of the conductive material pattern 430A, the thickness 430T of the conductive material pattern 430A may be less than (or substantially equal to) the thickness 420T of the first dielectric pattern 420A. In some embodiments in which the conductive layer 410 is a copper-containing layer and the conductive material pattern 430A is a solder-containing layer, intermetallic compounds IMC may be formed between the conductive layer 410 and the conductive material pattern 430A. The intermetallic compounds IMC may be or may not be present depending on the materials and amounts of the conductive layer 410 and the conductive material pattern 430A, so that the intermetallic compounds IMC are shown in the dashed lines in FIG. 1C to indicate it may be or may not be formed.

Referring to FIG. 1D and also referencing FIG. 1C, a lid 520 may be attached to the device package 10 and the third package component 300. After placement of the lid 520, the third package component 300 and the lid 520 may define a cavity within which the device package 10 is coupled to the third package component 300. In some embodiments, the lid 520 is substantially smaller than the third package component 300, although in other embodiments, the lid 520 has substantially similar dimensions as the third package component 300. It should be noted that the lid 520 may come in a variety of shapes and sizes as feasibly permitted depending on product requirements. The lid 520 may be rigid enough to protect the device package 10 and the third package component 300. In some embodiments, the lid 520 may counter-balance the forces exerted by the mismatch that is caused by the coefficients of thermal expansion (CTE) between the device package 10 and the third package component 300.

In some embodiments, the lid 520 is configured to spread heat generated from the device package 10 to a larger area and/or dissipate the heat from the device package 10. The lid 520 may be a heat dissipating component (e.g., heat sink, heat spreader, or the like) placed over the device package 10 by, for example, a placement process. The material of the lid 520 may be or may include copper, aluminum, gold, steel, stainless steel, metal alloy, combinations thereof, and/or other suitable material(s) having high thermal conductivities. In some embodiments, the lid 520 is an integrated-formed component. Alternatively, the lid 520 includes more than one piece that may be of the same or different materials, for example, the lid may include stiffeners adhered to the third package component and an upper plate adhered to the stiffeners.

In some embodiments, once the lid 520 has been placed, a bonding step (e.g., thermal) may be performed. The bonding of the lid 520 may entail hardening the conductive material pattern 430A, the first dielectric pattern 420A, and the second dielectric pattern 510A in the presence and/or absence of a compressive force and/or suitable mechanical pressure, whether by applying heat and/or by other means. For example, a clamp (not shown) is used to apply the force between the lid 520 and the third package component 300. Alternatively, the clamping force may be replaced depending on which means is employed to apply the force to the lid 520. For example, the lid 520 may be pressed toward the conductive material pattern 430A, the first dielectric pattern 420A, and the second dielectric pattern 510A, so that the conductive material pattern 430A and the first dielectric pattern 420A physically attach the device package 10 to the lid 520, and the second dielectric pattern 510A physically attach the third package component 300 to the lid 520.

In some embodiments, during the bonding, a thermal treatment process (e.g., the curing or the like) is performed at a process temperature of between about 150° C. and about 200° C. for time duration of between about 1 hour and about 3 hours. For example, during applying the force to the lid 520, the first dielectric pattern 420A and the second dielectric pattern 510A are cured and solidified to respectively form a first dielectric member 420 and a second dielectric member 510. In some embodiments, the conductive material pattern 430A is cured to form a plurality of thermally conductive members 430 during the same step. Alternatively, the conductive material pattern 430A is separately thermally treated depending on which type of conductive material(s) is used.

With continued reference to FIG. 1D and further referencing FIG. 2C, after the bonding is complete, the first package component 100 of the device package 10 may be thermally coupled to the lid 520 via the thermally conductive members 430. For example, the respective thermally conductive member 430 metallically bonds the overlying lid 520 to the underlying conductive layer 410. In some embodiments, the intermetallic compounds IMC is formed between the lid 520 and the thermally conductive members 430. The intermetallic compounds IMC may be or may not be present at two opposing sides of the thermally conductive members 430, so that the intermetallic compounds IMC are shown in the dashed lines herein. The first dielectric member 420 may surround a perimeter of the respective thermally conductive member 430 to maintain them within the predetermined area. The first dielectric member 420 may facilitate the thermal coupling between the lid 520 and the first package component 100, which depends on the material of the first dielectric member 420. The conductive layer 410, the first dielectric member 420, and the thermally conductive members 430 may be collectively viewed as a thermal interface material (TIM) structure 400A that is interposed between the lid 520 and the device package 10 to enhance the thermal coupling therebetween.

Still referring to FIG. 1D and FIG. 2C, under the pressure of being pressed against the lid 520, the first dielectric pattern 420A is deformed, and after the formation, the first dielectric member 420 may have a thickness 420T' ranging from about 10 μm to about 200 μm. The thickness 420T' of the first dielectric member 420 may be the portion of the first dielectric member 420 interposed between the lid 520 and the conductive layer 410. Other portion of the first dielectric member 420 may have greater thickness since the periphery of the first dielectric member 420 may extend to cover the device package 10 or even to the underfill layer UF2, as will be described later in other embodiments. For example, the first dielectric member 420 may have an outer protrusion 420p extending beyond the boundary of the conductive layer 410. In some embodiments, under the pressure of being pressed against the lid 520, the first dielectric pattern 420A tends to protrude outwardly beyond the extent defined by the device package 10 and/or the conductive layer 410. In some embodiments, the outer protrusion 420p extends downwardly to cover the sidewall 410s of the conductive layer 410. The outer protrusion 420p may (or may not) extend beyond the sidewall 410s of the conductive layer 410 to cover at least a portion of the sidewall SW of the device package 10 (e.g., the sidewall of the insulating encapsulation 120). The first dielectric member 420 may have a cross-sectional shape including, but not limited to, an oval, an ellipse, and a rectangle, a rectangle with slightly curved side, a rectangle with two convex curved sides, or other elongated shape. For example, the outer sidewall 420OW of the first dielectric member 420 is a curved surface having a curvature with absolute value greater than 0.

In some embodiments, the first dielectric pattern 420A protrudes inward to adjoin the conductive material pattern 430A. For example, the first dielectric member 420 has an inner protrusion 420q opposite to the outer protrusion 420p and laterally extending toward the thermally conductive members 430. The inner sidewall 420IW of the first dielectric member 420 physically connected to the thermally conductive members 430 may include a curved profile having a curvature with absolute value greater than 0. In some embodiments, the curvature of the inner sidewall 420IW may be different from that of the outer sidewall 420OW. In the cross-sectional view, the sidewall 430s of the respective thermally conductive member 430 and the inner sidewall 420IW of the first dielectric member 420 may be the match of the convex surface and concave surface and may be complementary to each other.

Still referring to FIG. 1D and further referencing FIG. 2D, after the bonding is complete, the third package component 300 may be physically coupled to the lid 520 through the second dielectric member 510. Depending on the material of the second dielectric member 510, the lid 520 may be thermally coupled to the third package component 300 through the second dielectric member 510. In some embodiments, the lid 520 is pressed into the second dielectric pattern 510A, and at least an end portion 520e of the lid 520 may be embedded into the second dielectric member 510. In some embodiments, only the lower surface of the end portion 520e is adhered to the second dielectric member 510. In some embodiments, under the pressure of being pressed against the lid 520, the second dielectric member 510 is deformed to expand outwardly beyond the width of the end portion 520e of the lid 520. The outer sidewall 510s of the second dielectric member 510 may be a curved surface having a curvature with absolute value greater than 0. In some embodiments, the lid 520 and the underlying second dielectric member 510 are located within the boundary defined by the sidewall 300s of the third package component 300.

Referring to FIG. 1E, a plurality of external terminals 320 may be formed on a bottom side 300b of the third package component 300. The device package 10 may be electrically coupled to the external terminals 320 through the third package component 300. The external terminals 320 may land on bond pads of the third package component 300 distributed at the bottom side 300b. The third package component 300 and the external terminals 320 may be collectively viewed as a package substrate. The external terminals 320 may be or may include solder balls, ball grid array (BGA), metal pillars, or another suitable connectors, and may be made of conductive materials, such as solder, copper, gold, silver, metal alloy, combinations thereof, or other suitable conductive materials. In some embodiments, the external terminals 320 is configured to be electrically coupled to external systems (not shown) and to transport signals (and/or power) to/from the external systems. For example, the external terminals 320 are formed after attachment of the lid 520 such that heat generated by the processes used to form the external terminals 320 may be dissipated through the lid 520. Alternatively, the external terminals 320 may be formed prior to the attachment of the lid 520, or the external terminals 320 may be omitted.

In some embodiments, a fifth package component 50 is electrically coupled to the bottom side 300b of the third package component 300 aside the array of the external terminals 320. For example, the fifth package component 50 is mounted on the third package component 300 using a surface mount technology (SMT) process or other suitable technique(s). In some embodiments, the fifth package component 50 is referred to as a surface mount device which includes one or more passive components (e.g., capacitors, resistors, inductors, the like, or a combination thereof). The fifth package component 50 may not include (or may include) active devices such as transistors. Alternatively, the fifth package component 50 is omitted. It is noted that the number and the configuration of the fifth package component 50 shown herein are merely for illustrative purposes and construe no limitation in the disclosure. The fifth package component 50 may be mounted onto the third package component 300 prior to or after the formation of the external terminals 320. Up to here, the fabrication of a package structure PS1 is substantially complete.

With continued reference to FIG. 1E, the package structure PS1 includes the TIM structure 400A which serves to decrease thermal resistance that may take place between the lid 520 and the device package 10. The TIM structure 400A includes the thermally conductive members 430 which are used to join the lid 520 and the conductive layer 410 overlying the device package 10 and also provide an efficient thermally conductive path between the lid 520 and the underlying structure. The first dielectric member 420 laterally encircling the thermally conductive members 430 and interposed between the lid 520 and the conductive layer 410 overlying the device package 10 may act as a dam structure to isolate the thermally conductive members 430 from one another. The first dielectric member 420 may be a reliable adhesion layer to adhere the lid 520 to the underlying structure. In some embodiments, the first dielectric member 420 functions as a buffer layer for absorbing the thermo-mechanical stresses between the lid 520 and the device package 10. It is understood that the rigid type thermal interface material (e.g., solder) may not be capable of absorbing the thermo-mechanical stresses between the lid 520 and the device package 10; therefore, delamination or cracks ay occur in the rigid type thermal interface material during thermal cycling. By forming the thermally conductive members 430 as discrete elements and forming the first dielectric member 420 as a buffer layer to surround the thermally conductive members 430, the package structure PS1 having good heat dissipation efficiency and reliability may be obtained.

Figure 1F:
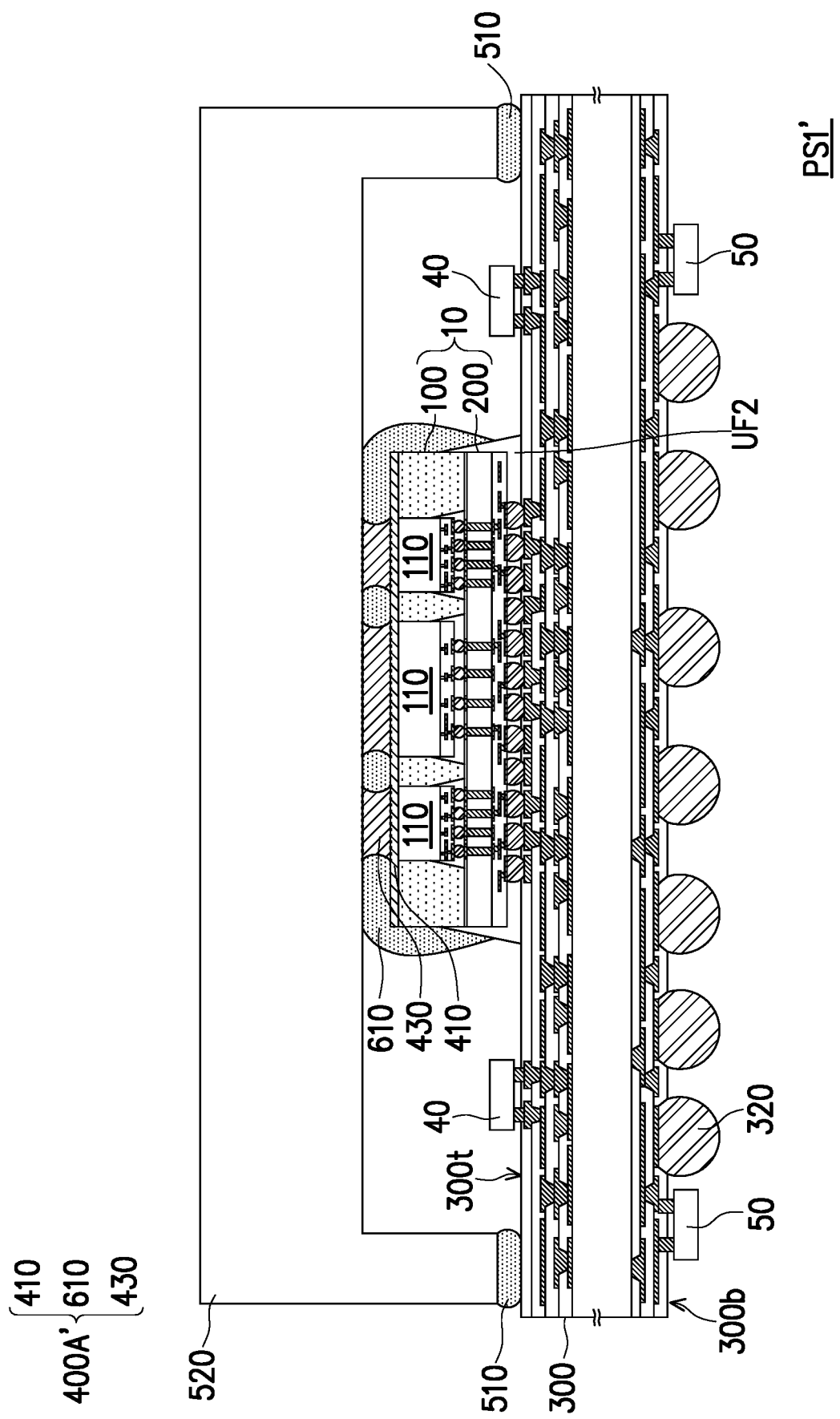
FIG. 1F is a schematic cross-sectional view of a package structure in accordance with some embodiments.

FIG. 1F is a schematic cross-sectional view of a package structure in accordance with some embodiments. The package structure PS1' shown in FIG. 1F may be similar to the package structure PS1 shown in FIG. 1E, like reference numbers are used to designate like elements, and the detailed descriptions may be omitted for the sake of brevity. Referring to FIG. 1F and with reference to FIG. 1E, the difference between the package structures PS1 and PS1' includes that the first dielectric member 610 of the TIM structure 400A'.

In some embodiments, the first dielectric member 610 extends from the gap between the lid 520 and the conductive layer 410 and covers along the sidewall of the device package 100 to at least a portion of the underfill layer UF2. For example, when forming the first dielectric pattern as described in FIG. 1B, the dielectric material may be dispensed onto the underfill layer UF2 and the top surface of the conductive layer 410 via the dispensing unit. In this manner, the first dielectric member 610 of the TIM structure 400A' may cover the upper sidewall of the device package 100 and the underfill layer UF2 covers the lower sidewall of the device package 100.

Figure 3:
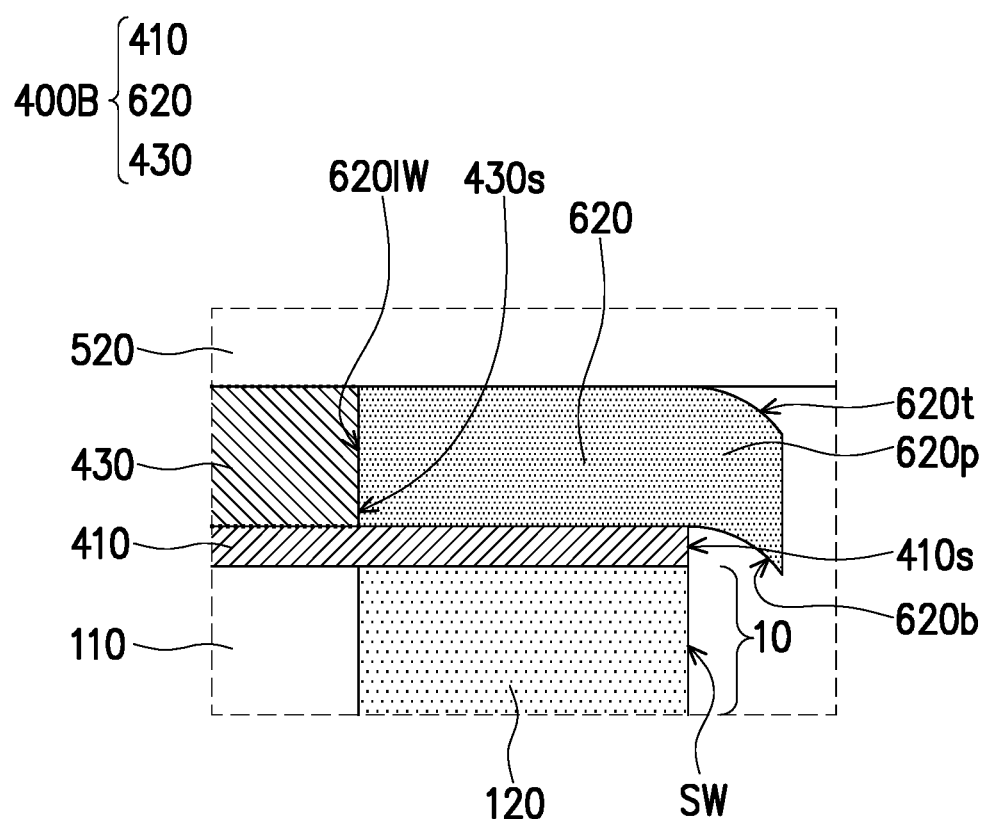
FIG. 3 is a schematic and enlarged view of a portion of another implementation of a package structure in accordance with some embodiments.

FIG. 3 is a schematic and enlarged view of a portion of another implementation of a package structure in accordance with some embodiments. The structure shown in FIG. 3 may be similar to the structure shown in FIG. 2C, and like reference numbers are used to designate like elements. Referring to FIG. 3 and further referencing FIG. 2C, the difference of the structures shown in FIGS. 2C and 3 includes the first dielectric member 620 of the TIM structure 400B. For example, the conductive layer 410, the first dielectric member 620, and the thermally conductive members 430 are collectively viewed as the TIM structure 400B, where the first dielectric member 620 is made of a sheet with openings. The sheet may be or may include a composite polymer sheet including additives (e.g., graphite, carbon nanotubes (CNTs), or the like). Other suitable attach-film may be used. In some embodiments, the sheet is attached onto the conductive layer 410 to form the first dielectric pattern, and then the conductive material pattern is formed within the openings of the sheet. During the bonding of the lid 520, the sheet may be pressed to protrude outwardly beyond the underlying structure.

With continued reference to FIG. 3, the first dielectric member 620 includes an outer protrusion 620p laterally extending beyond the sidewall of the underlying conductive layer 410. The outer protrusion 620p of the first dielectric member 620 may extend in a direction away from the adjacent thermally conductive member 430. For example, the outer protrusion 620p may hang downwardly without physically contacting the lid 520 and/or the underlying structure. In some embodiments, the periphery of the top surface 620t of the first dielectric member 620 (e.g., the top surface of the outer protrusion 620p) is spatially separated from the lid 520. The periphery of the bottom surface 620b of the first dielectric member 620 (e.g., the bottom surface of the outer protrusion 620p) may extend from the extent of the underlying structure and may be spatially separated from the sidewall 410s of the conductive layer 410 and the sidewall SW of the device package 10. Any suitable cross-sectional shapes (e.g., rectangle with slightly curved side(s), rectangle with two convex curved sides, oval, ellipse, or the like) may be used to implement the first dielectric member 620 in accordance with some embodiments.

Figure 4A:
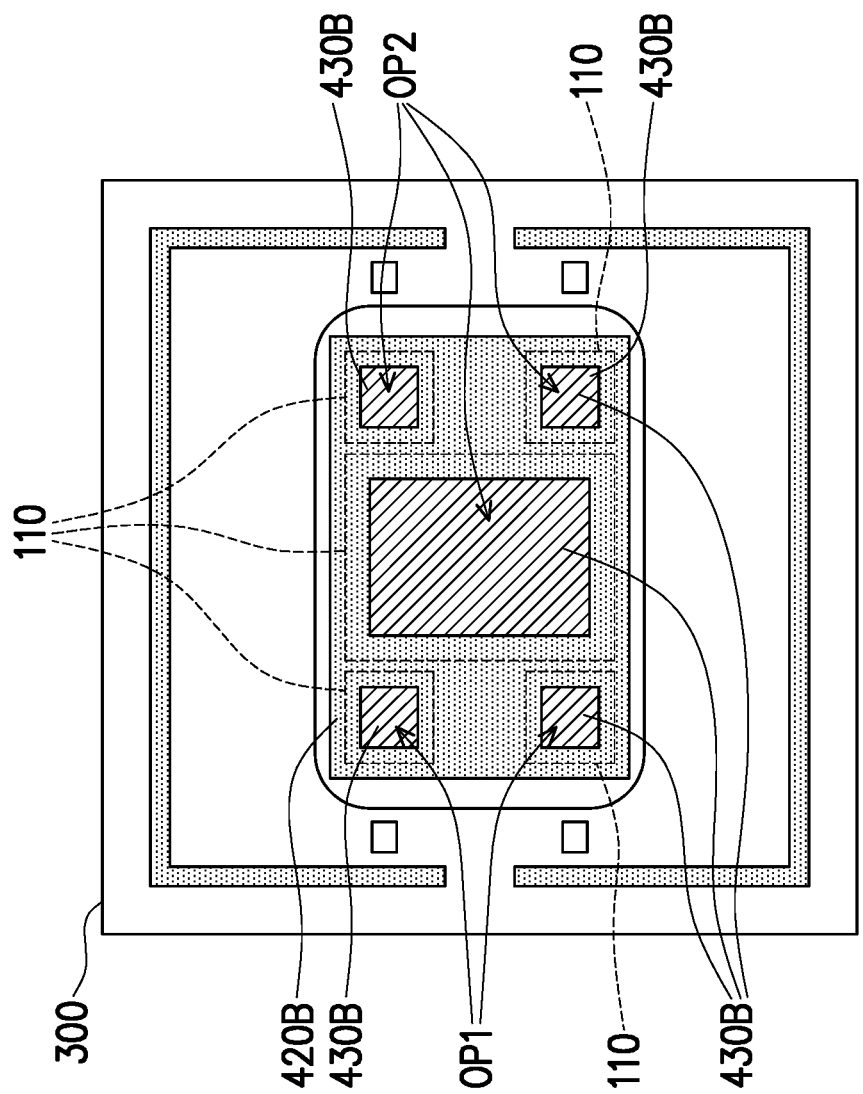
FIG. 4A is a schematic top-down view of another implementation of a structure shown in FIG. 1C in accordance with some embodiments.
Figure 4B:
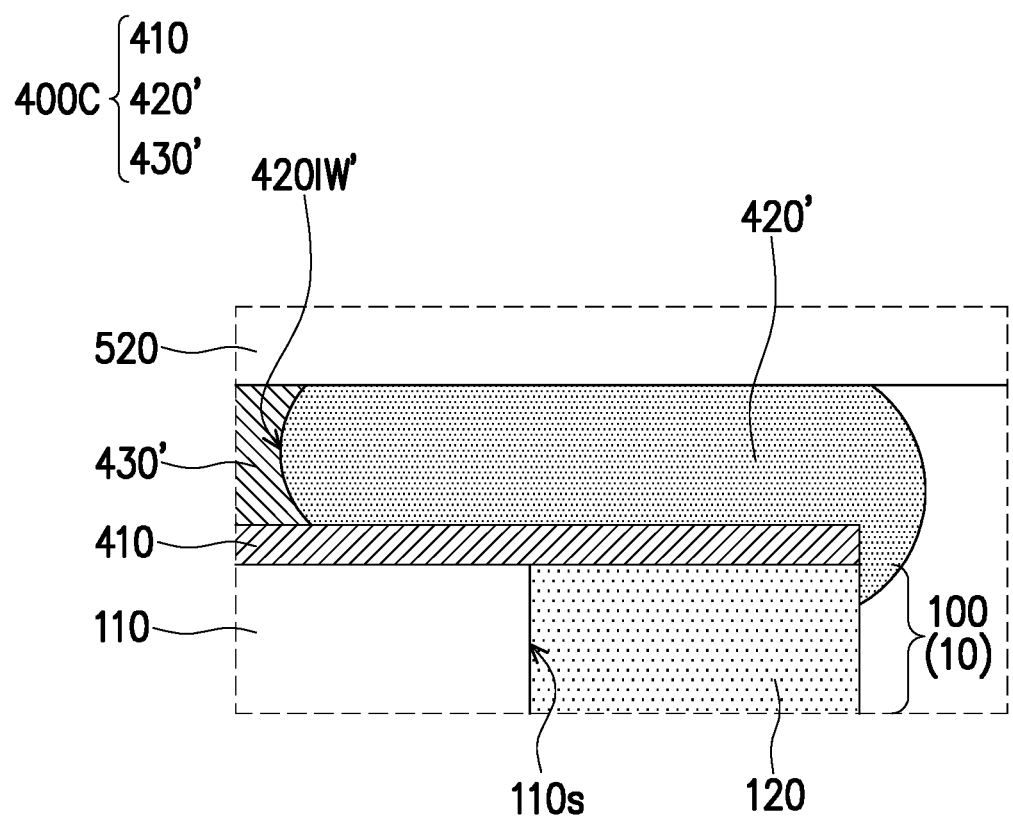
FIG. 4B is a schematic and enlarged view of a portion of another implementation of a package structure in accordance with some embodiments.

FIG. 4A is a schematic top-down view of another implementation of a structure shown in FIG. 1C in accordance with some embodiments, and FIG. 4B is a schematic and enlarged view of a portion of another implementation of a package structure in accordance with some embodiments. The structure shown in FIG. 4A may be similar to the structure shown in FIG. 2B, the structure shown in FIG. 4B may be similar to the structure shown in FIG. 2C, and like reference numbers are used to designate like elements.

Referring to FIG. 4A and further referencing FIGS. 1C and 2B, the difference of the structures shown in FIGS. 4A and 2B includes that the opening size of the first dielectric pattern 420B may be smaller than that of the first dielectric pattern 420A shown in FIG. 2B. In some embodiments, the openings OP2 of the first dielectric pattern 420B are arranged in the desired locations within the extents defined by the semiconductor dies 110, as shown in the top-down view. It is noted that the semiconductor dies 110 are shown in phantom to indicate that those semiconductor dies 110 are disposed below the first dielectric pattern 420B. The conductive material pattern 430B disposed inside the openings OP2 of the first dielectric pattern 420B may be located right on the respective semiconductor die 110. For example, in the top-down view, the surface area of the conductive material pattern 430B is less than the area defined by the extent of the corresponding semiconductor die 110. The conductive material pattern 430B may have a material similar to the material of the conductive material pattern 430A described in preceding paragraphs, so the details are not repeated for the sake of brevity.

Referring to FIG. 4B and further referencing FIGS. 4A and 2C, the lid 520 may be bonded to the device package 10 through the TIM structure 400C. The TIM structure 400C may include the conductive layer 410, the thermally conductive members 430' overlying the conductive layer 410, and the first dielectric member 420' adjoining the thermally conductive members 430'. For example, after forming the first dielectric pattern 420B and the conductive material pattern 430B as shown in FIG. 4A, the lid 520 is disposed thereon by the method described in preceding paragraphs. During the attachment of the lid 520, the first dielectric pattern 420B is squeezed and deformed to form the first dielectric member 420'. The first dielectric member 420' may be similar to the first dielectric member 420 described in FIG. 2C, so the detailed descriptions are not repeated for the sake of brevity.

The difference between the first dielectric member 420' and 420 lies in the location of the boundary of the first dielectric member 420' relative to the sidewall 110s of the semiconductor die 110. For example, the inner sidewall 420IW' of the first dielectric member 420' is located above and within the extent defined by the semiconductor die 110. Alternatively, the inner sidewall of the first dielectric member may be substantially leveled with the sidewall of the semiconductor die or may be laterally offset from the sidewall of the semiconductor die, which depends on the product requirements. It should be noted that the opening sizes of the first dielectric member construe no limitation in the disclosure as long as the resulting thermally conductive members formed in the openings effectively dissipate heat and reduce thermal resistance of the device package 10.

Figure 5:
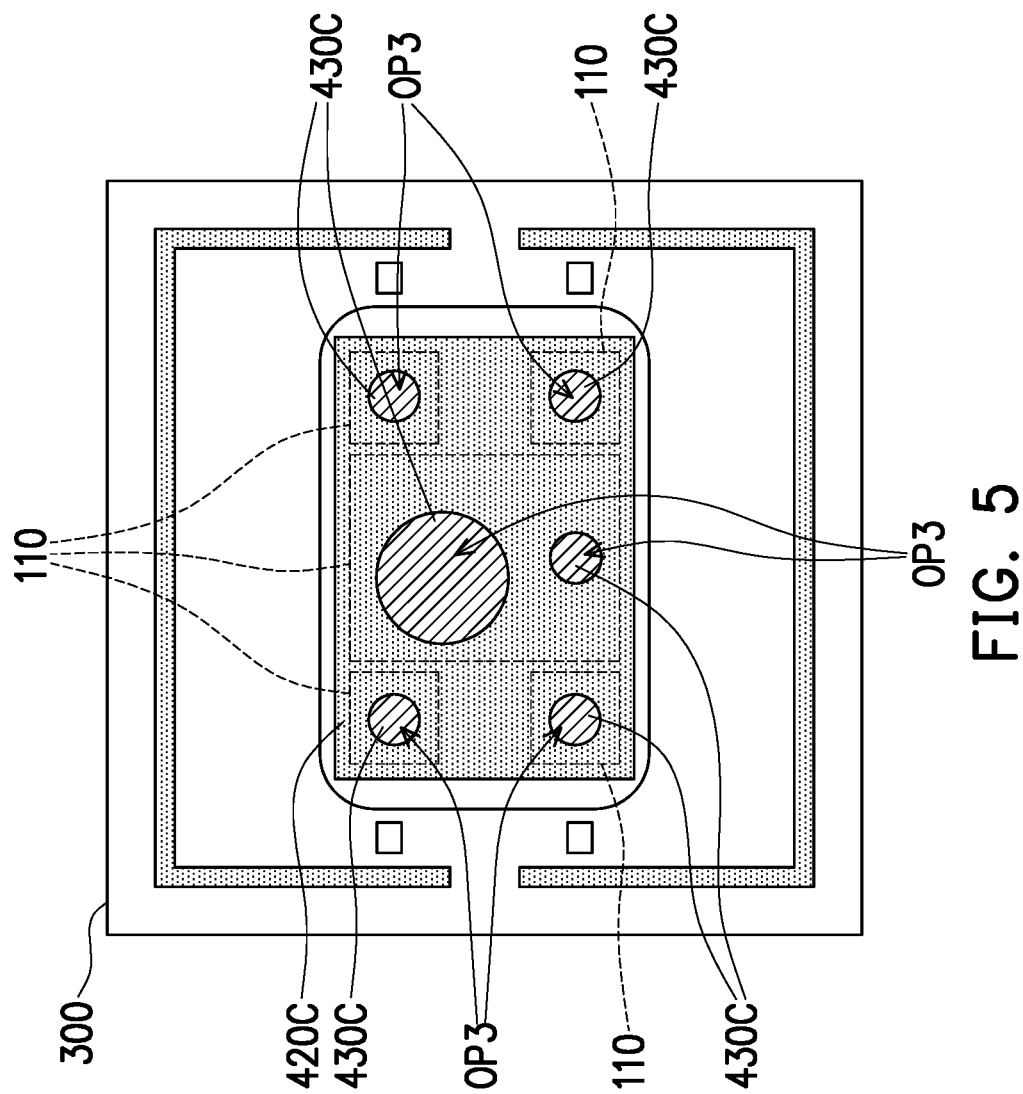
FIG. 5 is a schematic top-down view of another implementation of a structure shown in FIG. 1C in accordance with some embodiments.

FIG. 5 is a schematic top-down view of another implementation of a structure shown in FIG. 1C in accordance with some embodiments. The structure shown in FIG. 5 may be similar to the structure shown in FIG. 4A, and like reference numbers are used to designate like elements. Referring to FIG. 5 and further referencing FIG. 4A, the difference of the structures shown in FIGS. 5 and 4A includes the opening configuration of the first dielectric pattern 420C. For example, the first dielectric pattern 420C is provided with the openings OP3 having circular top-view shapes. It is noted that the openings of the first dielectric pattern 420C may have any top-view shape including, for example, rectangle, square, circle, ellipse, polygon, combinations thereof, etc. The openings OP3 and the semiconductor dies 110 may be or may not be in a one-to-one correspondence. For example, more than one opening OP3 is formed corresponding to the larger one of the semiconductor dies 110.

In some embodiments, the openings OP3 are partially or entirely located corresponding to hot spot regions on the semiconductor dies 110. For example, the heat may be trapped within some regions of the device package causing a sharp local temperature peak, and those regions are referred to as the hot spot regions. The conductive material pattern 430C may be formed in the openings OP3 to be positioned right above the hot spot regions of the semiconductor dies 110. In this manner, the thermal conductive members formed by the conductive material pattern 430C may provide efficient thermal conductions between the device package and the lid. The conductive material pattern 430C may have a material similar to the material of the conductive material pattern 430A described in preceding paragraphs, so the details are not repeated for the sake of brevity. It is understood that the shape, the number, and the configuration of the openings are merely for illustrative purposes, and other shapes, number, and configurations may be implemented to meet the design criteria of a particular application.

Figure 6A:
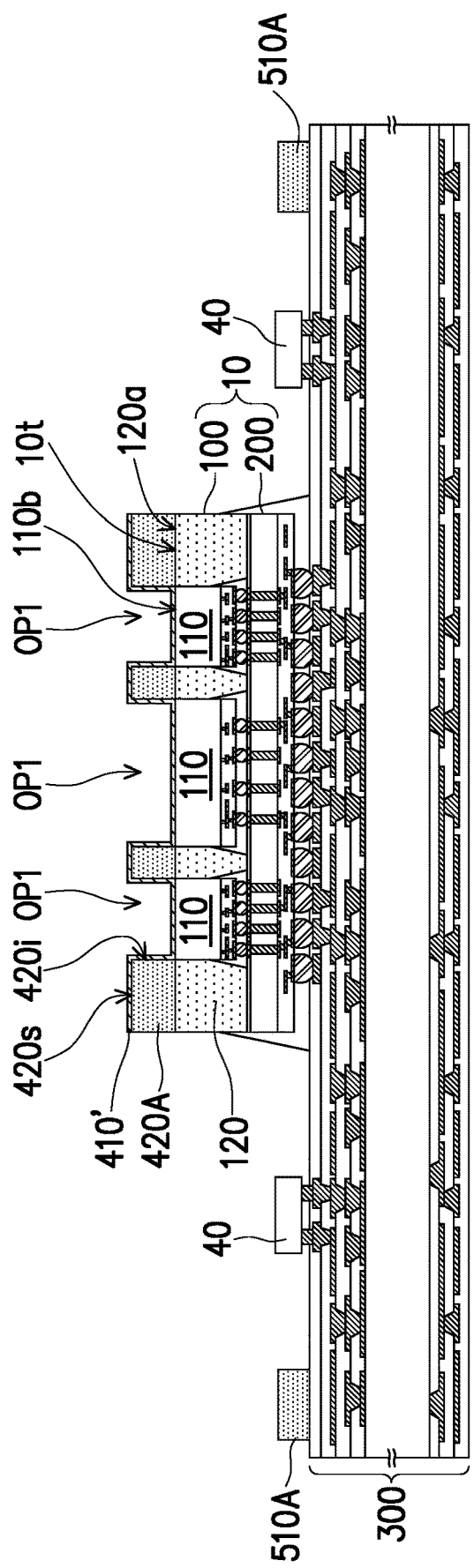
FIGS. 6A-6C are schematic cross-sectional views of various stages of manufacturing a package structure in accordance with some embodiments.
Figure 6B:
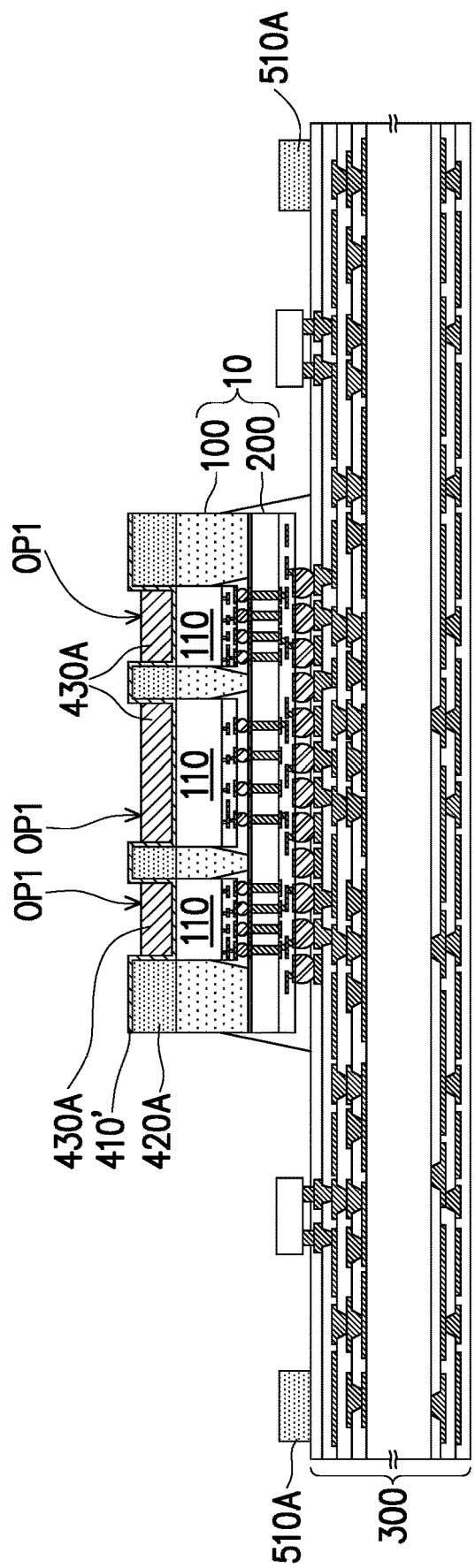
Figure 6C:
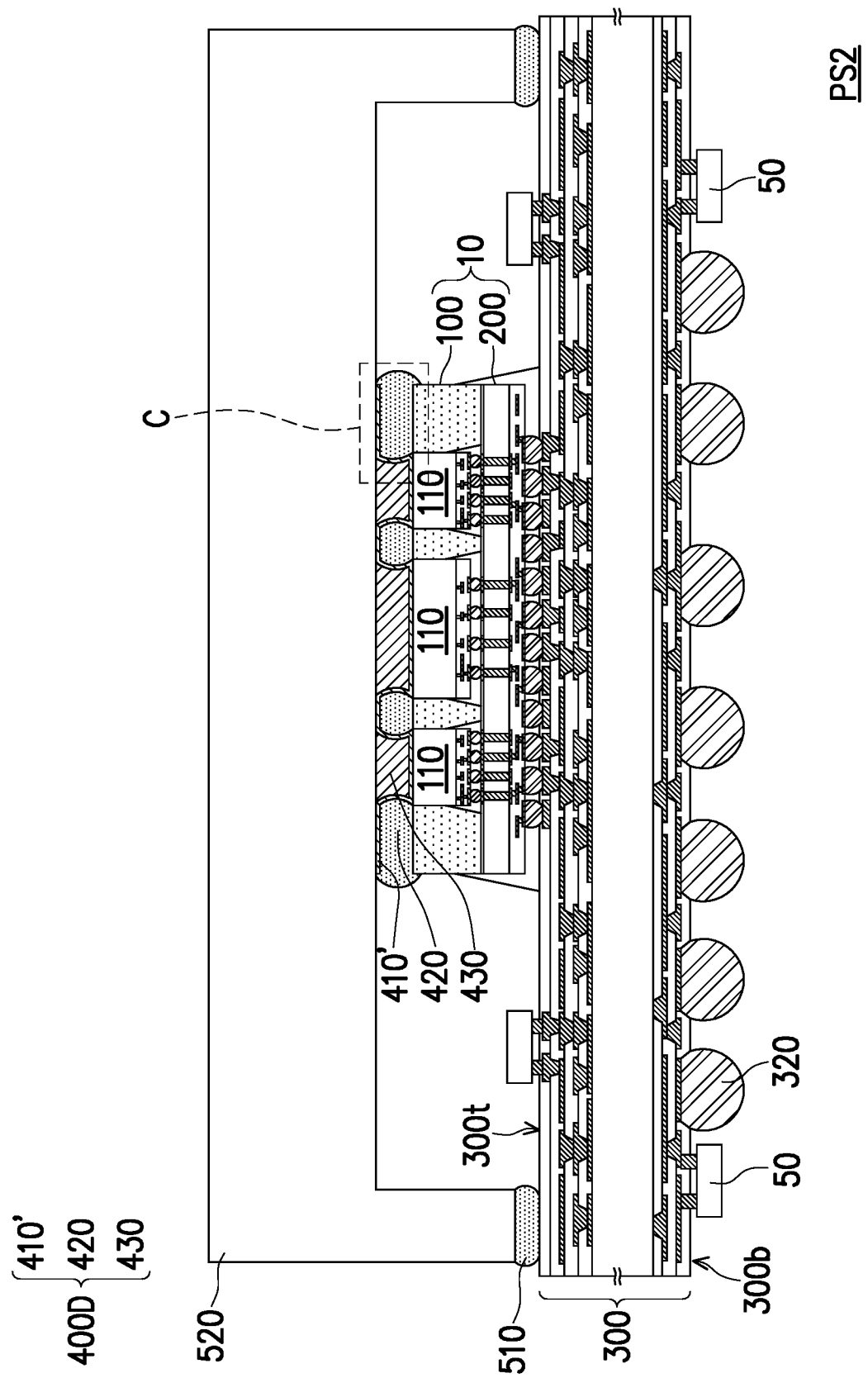
Figure 7:
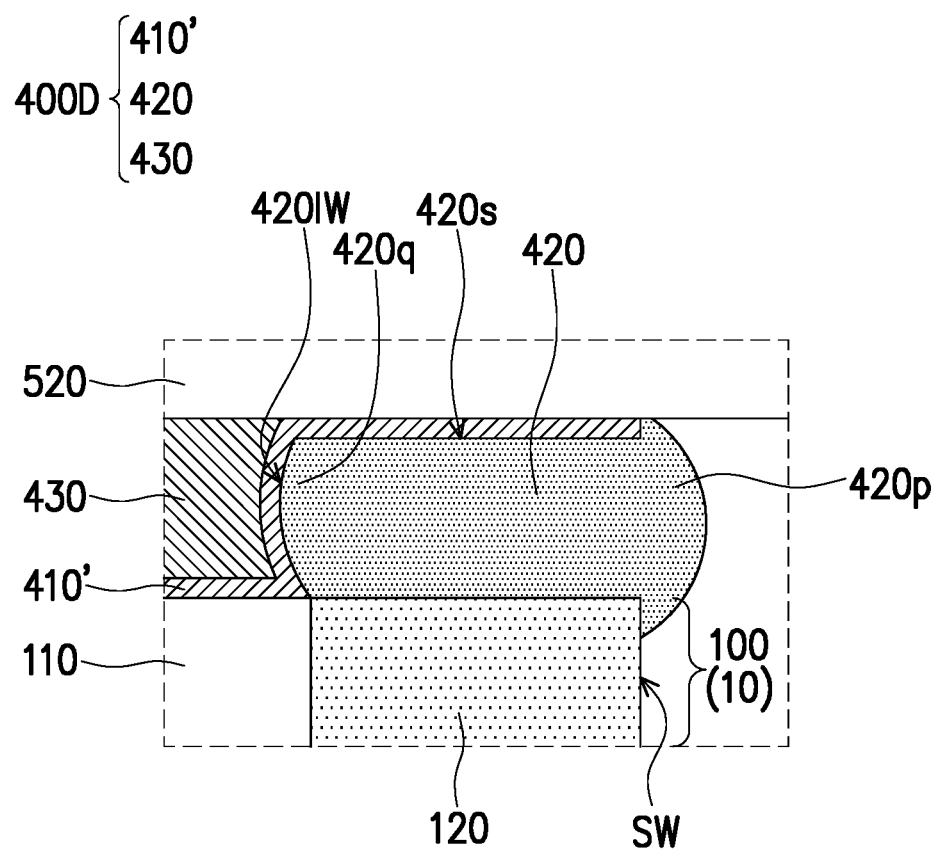
FIG. 7 is a schematic and enlarged view of a dashed box C shown in FIG. 6C in accordance with some embodiments.

FIGS. 6A-6C are schematic cross-sectional views of various stages of manufacturing a package structure in accordance with some embodiments, and FIG. 7 is a schematic and enlarged view of a dashed box C shown in FIG. 6C in accordance with some embodiments. Unless specified otherwise, the materials and the formation methods of the components in these embodiments are essentially the same as the like components, which are denoted by like reference numerals in the embodiments in preceding paragraphs.

Referring to FIG. 6A, the structure shown in FIG. 6A is similar to the structure shown in 1B, except that the conductive layer 410' is conformally formed on the first dielectric pattern 420A. For example, the first dielectric pattern 420A is formed prior to the formation of the conductive layer 410'. In some embodiments, the first dielectric pattern 420A is directly formed on the upper surface 10t of the device package 10, wherein the upper surface 10t may be an inactive surface opposite to an active surface (e.g., the first side 200a of the second package component 200 labeled in FIG. 1A). For example, the first dielectric pattern 420A is formed on the upper surface 120a of the insulating encapsulation 120, and the openings OP1 of the first dielectric pattern 420A may accessibly expose at least a portion of the rear surface (e.g., the second side 110b) of the respective semiconductor die 110. It should be understood that the first dielectric pattern 420A can be replaced with other first dielectric pattern described elsewhere in the disclosure. The second dielectric pattern 510A may be formed on the third package component 300 at the same step of forming the first dielectric pattern 420A. Alternatively, the second dielectric pattern 510A may be formed before or after the formation of the first dielectric pattern 420A.

In some embodiments, after forming the first dielectric pattern 420A, the conductive layer 410' may be formed on the first dielectric pattern 420A using such as sputtering or other suitable process. The material of the conductive layer 410' may be similar to the conductive layer 410 described in FIG. 1A. For example, the conductive layer 410' may formed in the respective opening OP1 to be in direct contact with the rear surface (e.g., the second side 110b) of the respective semiconductor die 110. In some embodiments, the conductive layer 410' may blanketly cover the inner sidewalls 420i of the first dielectric pattern 420A and may further extend to cover the upper surface 420s of the first dielectric pattern 420A.

Referring to FIG. 6B, the conductive material pattern 430A may be formed on the conductive layer 410' and within the openings OP1 of the first dielectric pattern 420A. The material and the forming process of the conductive material pattern 430A may be similar to those of the conductive material pattern 430A described in FIG. 1C, so the detailed descriptions are not repeated for the sake of brevity. The conductive layer 410' may be interposed between the conductive material pattern 430A and the semiconductor dies 110 of the device package 10 in a thickness direction. In some embodiments, the conductive layer 410' is interposed between the conductive material pattern 430A and the first dielectric pattern 420A in a lengthwise (or widthwise) direction.

Referring to FIG. 6C and FIG. 7, a package structure PS2 is provided. For example, after forming the conductive material pattern 430A, the subsequent processes may be similar to the processes described in FIGS. 1D-1E. The lid 520 may be placed over and bonded to the top side 300t of the third package component 300 via the second dielectric member 510 formed by the second dielectric pattern 510A. For example, the TIM structure 400D includes the conductive layer 410', the first dielectric member 420 formed by the first dielectric pattern 420A, and the thermally conductive members 430 formed by the conductive material pattern 430A. The thermally conductive members 430 may thermally and physically interface both the lid 520 and the device package 10. In some embodiments, the conductive layer 410' and the overlying first dielectric member 420 also provide adequate the adhesion between the lid 520 and the device package 10. After the attachment of the lid 520, the external terminals 320 and the fifth package components 50 are optionally formed on the bottom side 300b of the third package component 300.

With continued reference to FIG. 7, during the bonding of the lid 520, the first dielectric pattern 420A is pressed and deformed to form the first dielectric member 420 having protrusions (e.g., 420p and 420q described in FIG. 2C). The conductive layer 410' formed on the inner sidewalls 420IW of the first dielectric member 420 may be deformed to have a curve profile in the cross-sectional view and to conform to the inner sidewalls 420IW of the first dielectric member 420. In some embodiments, after the attachment of the lid 520, the conductive layer 410' is interposed between the lid 520 and the upper surface 420s of the first dielectric member 420. In some embodiments, the outer protrusion 420p of the first dielectric member 420 may have a rounded side in the cross-sectional view and may extend beyond the conductive layer 410' to be in direct contact with the lid 520 and also cover the sidewall SW of the device package 10. Alternatively, the first dielectric member is made of a sheet of polymer, and the protrusions of the first dielectric member may hang down due to gravity as shown in FIG. 3. In some embodiments, the first dielectric member 420 is replaced with the first dielectric member 610 shown in FIG. 1F.

Figure 8A:
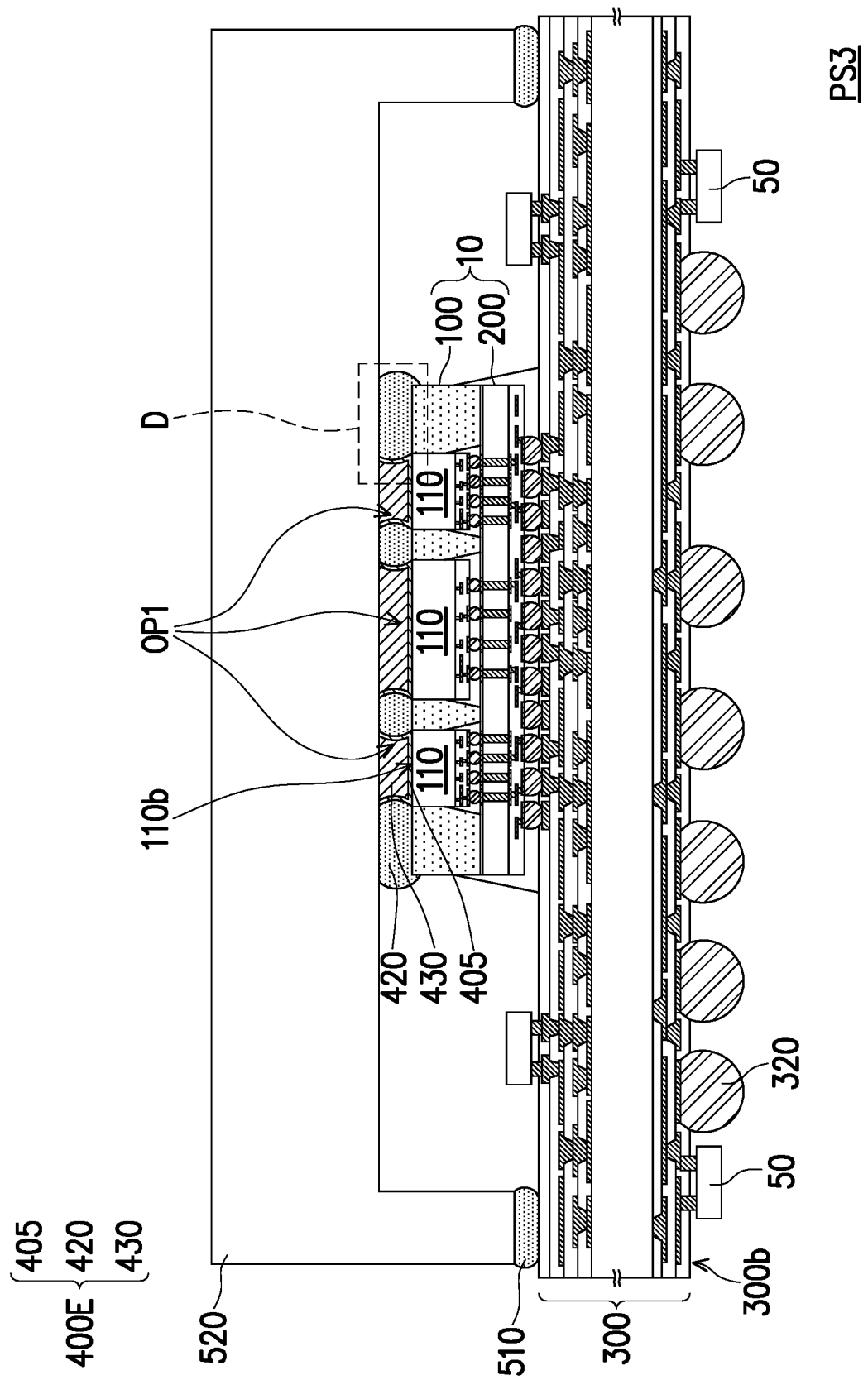
FIG. 8A is a schematic cross-sectional view of a package structure in accordance with some embodiments.
Figure 8B:
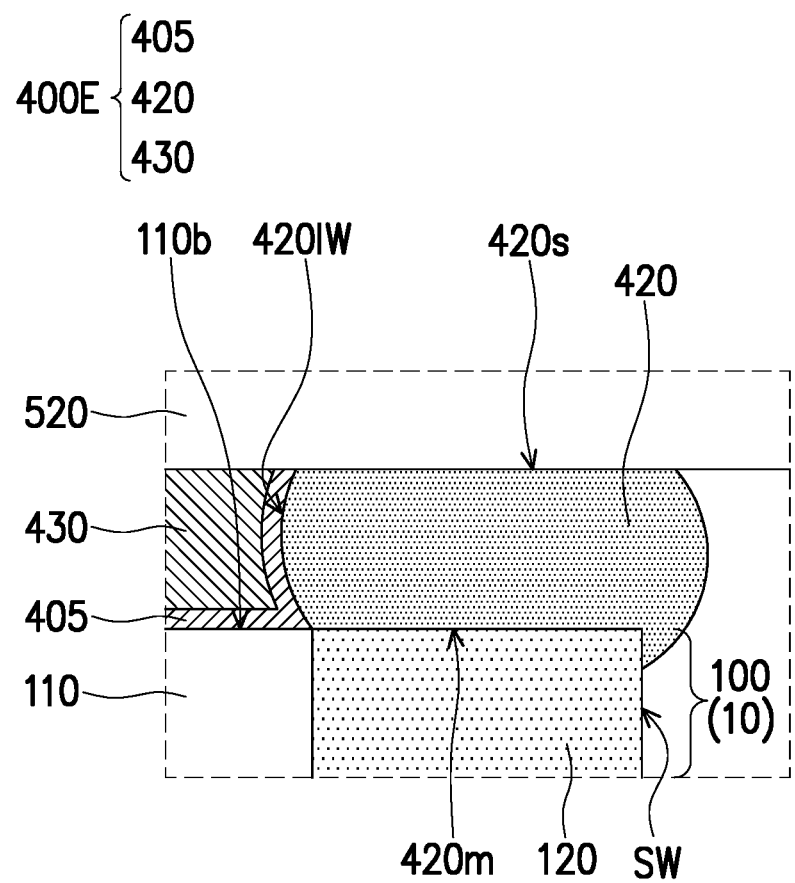
FIG. 8B is a schematic and enlarged view of a dashed box D shown in FIG. 8A in accordance with some embodiments.

FIG. 8A is a schematic cross-sectional view of a package structure in accordance with some embodiments, and FIG. 8B is a schematic and enlarged view of a dashed box D shown in FIG. 8A in accordance with some embodiments. A package structure PS3 shown in FIG. 8A may be similar to the package structure PS2 shown in FIG. 6C, the enlarged view shown in FIG. 8B may be similar to the enlarged view shown in FIG. 7, so the detailed descriptions are not repeated for the sake of brevity. Like reference numbers are used to designate like elements.

Referring to FIGS. 8A-8B and further referencing FIGS. 6C and 7, the difference between the package structure PS3 and the package structure PS2 includes the configuration of the TIM structure 400E. For example, the TIM structure 400E includes the first dielectric member 420, the thermally conductive members 430 disposed in the openings OP1 of the first dielectric member 420, and the conductive layer 405 conformally disposed in the openings OP1 to separate the respective thermally conductive member 430 from the first dielectric member 420. In some embodiments, when forming the conductive layer 405, the upper surface of the first dielectric pattern is covered be a mask layer (not shown), such that the conductive layer 405 may be conformally formed in the openings of the first dielectric pattern. The mask layer may be removed before forming the conductive material pattern in the openings of the first dielectric pattern. Alternatively, the mask layer is removed after the formation of the conductive material pattern and before bonding the lid 520 to the device package 10.

In some embodiments, the conductive layer 405 of the package structure PS3 is formed only in the opening of the first dielectric member 420, so that the inner sidewalls 420IW of the first dielectric member 420 and the rear surfaces (e.g., the second sides 110b) of the semiconductor dies 110 are covered by the conductive layer 405. The upper surface 420s of the first dielectric member 420 may be in direct contact with the lid 520, and the lower surface 420m of the first dielectric member 420 may be in direct contact with the insulating encapsulation 120 of the underlying first package component 100 of the device package 10. In some embodiments, the lower surface of the first dielectric member may further extend to be in physical contact with portions of the rear surfaces of the semiconductor dies. In some embodiments, the first dielectric member 420 is replaced with the first dielectric member 610 shown in FIG. 1F. Although the first dielectric member may be replaced with any first dielectric member described elsewhere in the disclosure.

Figure 9A:
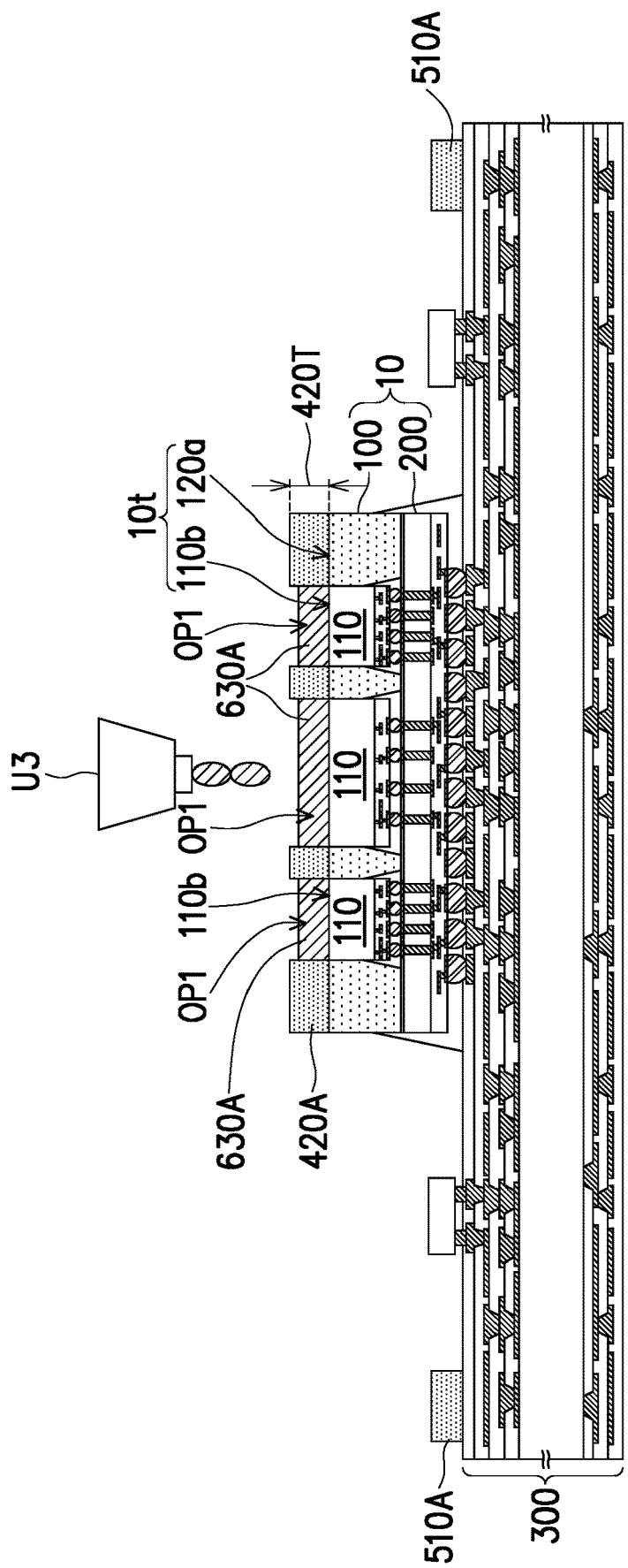
FIGS. 9A-9B are schematic cross-sectional views of various stages of manufacturing a package structure in accordance with some embodiments.
Figure 9B:
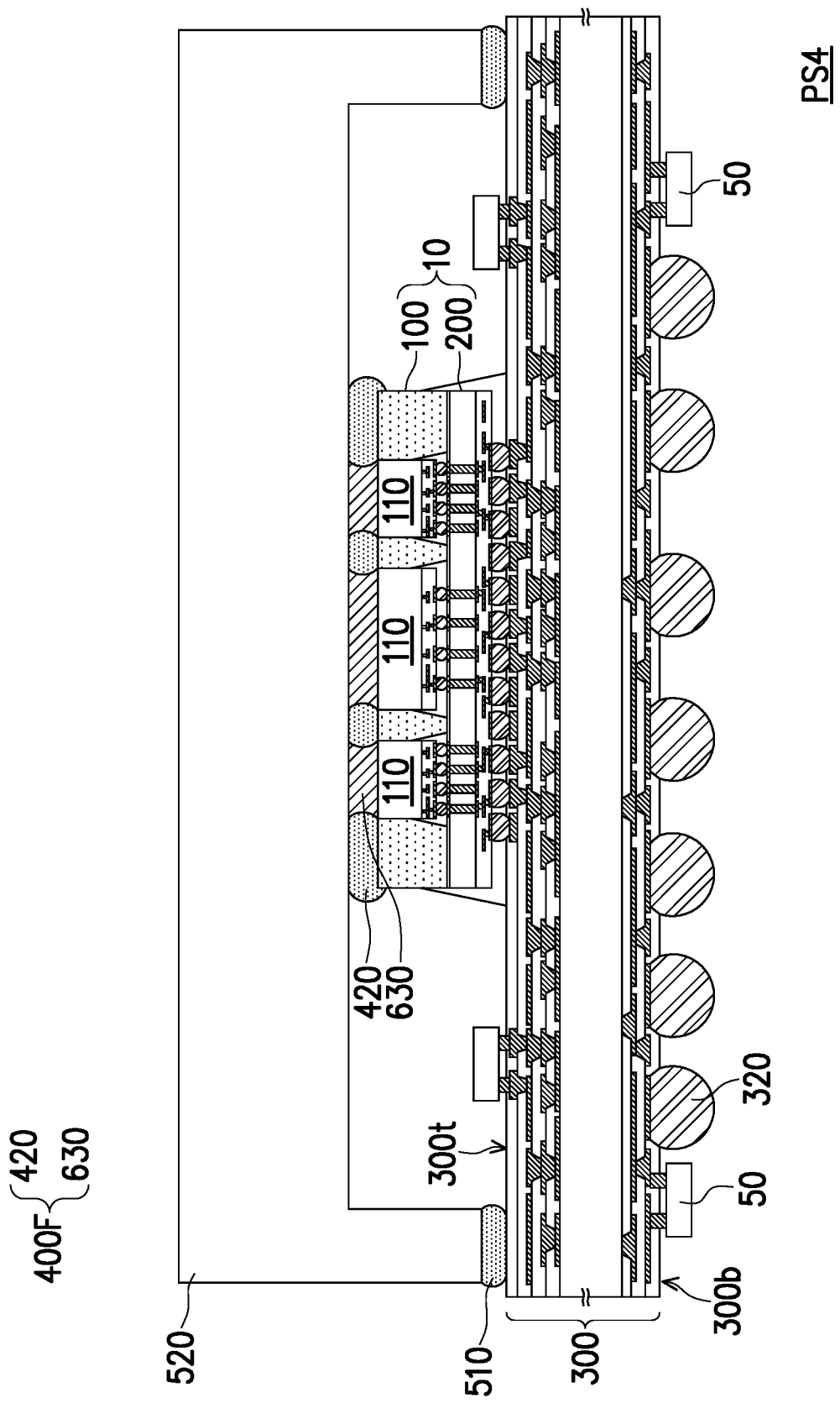

FIGS. 9A-9B are schematic cross-sectional views of various stages of manufacturing a package structure in accordance with some embodiments. Unless specified otherwise, the materials and the formation methods of the components in these embodiments are essentially the same as the like components, which are denoted by like reference numerals in the embodiments in preceding paragraphs.

Referring to FIG. 9A and further referencing FIG. 1B, the structure shown in FIG. 9A may be similar to the structure shown in FIG. 1B, except that the conductive layer 410 in FIG. 1B is omitted and the material of the conductive material pattern 630A is different from that of the conductive material pattern 430A in FIG. 1B. For example, the first dielectric pattern 420A is formed on the upper surface 10t of the device package 10. In some embodiments, the first dielectric pattern 420A is in direct contact with the upper surface 120a of the insulating encapsulation 120. The first dielectric pattern 420A may further extend to be in physical contact with at least portions of the rear surfaces (e.g., the second sides 110b) of the semiconductor dies 110. The rest portions of the rear surfaces (e.g., the second sides 110b) of the semiconductor dies 110 may be accessibly revealed by the openings OP1 of the first dielectric pattern 420A.

After forming the first dielectric pattern 420A, the conductive material pattern 630A may be formed in the openings OP1 of the first dielectric pattern 420A. For example, a cleaning process is optionally performed onto the rear surfaces (e.g., the second sides 110b) of the semiconductor dies 110 that are revealed by the openings OP1 in preparation for the conductive material pattern 630A. The conductive material pattern 630A may be or may include any suitable thermal interface material(s) to provide the thermal interface. For example, the conductive material pattern 630A is made of a metallic interface composition including gallium, indium, tin, bismuth, silver, lead, and/or their alloys, etc. The conductive material pattern 630A may include a material other than metal (or metal alloy) such as graphite or the like. For example, a viscosity of the conductive material pattern 630A ranges from 0 to about 10000 mPa·s. In some embodiments, the conductive material pattern 630A includes gallium-based alloy with a viscosity ranging from about 1.75 mPa·s to about 4 mPa·s, measured at 25° C. However, any suitable range and any suitable metal-based alloy may be used. In some embodiments, the conductive material pattern 630A is made of a liquid metal eutectic alloy consisting of gallium, indium, and tin. Other metal alloy(s) or a low-melting point alloy may be used. In some embodiments, the conductive material pattern 630A includes conductive material(s) in a liquid state at room temperature or at an operating temperature of the semiconductor die 110. In some embodiments, the conductive material pattern 630A has superior thermal conductivity and a lower-melting point. In some embodiments, the conductive material pattern 430A has a thermal conductivity greater than about 15 W/m·K, e.g., in the range of about 15 W/m·K to about 100 W/m·K or in the range of about 40 W/m·K to about 100 W/m·K. The melting point of the conductive material pattern 630A may be below the room temperature (e.g., 25° C.) and/or below the operating temperature of the semiconductor die 110. In some embodiments, the melting point of the conductive material pattern 630A is lower than 20° C. It is noted that the conductive material pattern 630A may have other value of the melting point depending on the content of conductive material.

With continued reference to FIG. 9A, the conductive material pattern 630A is formed in the openings OP1 of the first dielectric pattern 420A by a dispensing process using a dispensing unit U3. However, other suitable deposition process may be used to form the conductive material pattern 630A. The viscosity of the first dielectric pattern 420A may be several hundred or hundred thousand times greater than the viscosity of the conductive material pattern 630A. For example, the difference of the viscosity between the first dielectric pattern 420A and the conductive material pattern 630A is at least 5 thousand times. The thickness 420T of the first dielectric pattern 420A may be great enough to stop the overflow of the conductive material pattern 630A. For example, the first dielectric pattern 420A acting as a dam structure may prevent the conductive material pattern 630A which is in the liquid state from spreading beyond the intended areas. It is noted that the first dielectric member may be replaced with any first dielectric member described elsewhere in the disclosure. In some embodiments, the conductive material pattern 630A made of the liquid metal eutectic alloy may not form a permanent bond with the underlying device package 10. In some embodiments in which the semiconductor dies have non-coplanar rear surfaces, the conductive material pattern 630A made of the liquid metal eutectic alloy provide the required properties to conform to those non-coplanar rear surfaces and to form reliable connections between the lid and the device package.

Referring to FIG. 9B, a package structure PS4 is provided. For example, after forming the conductive material pattern 630A, the subsequent processes may be similar to the processes described in FIGS. 1D-1E. The lid 520 may be bonded to the top side 300t of the third package component 300 via the second dielectric member 510 formed by the second dielectric pattern 510A (labeled in FIG. 9A). During the bonding, the first dielectric pattern 420A may be pressed and deformed to form the first dielectric member 420 having protrusions (e.g., 420p and 420q shown in FIG. 2C). Alternatively, the first dielectric member is made of a sheet of polymer, and the protrusions of the first dielectric member may not be physically in contact with the lid and/or the device package as shown in FIG. 3. In some embodiments, the first dielectric member 420 is replaced with the first dielectric member 610 shown in FIG. 1F.

In some embodiments, a curing process is performed during the bonding a process temperature of between about 125° C. and about 150° C. for time duration of between about 1 hour and about 3 hours. Once cured, the third package component 300 may be physically attached and thermally coupled to the lid 520 by the second dielectric member 510. The lid 520 and the device package 10 may be coupled via the TIM structure 400F including the thermally conductive members 630 and the first dielectric member 420. For example, the thermally conductive members 630 formed by the conductive material pattern 630A (labeled in FIG. 9A) thermally and physically interface both the lid 520 and the device package 10, and the thermally conductive members 630 may greatly expedite the rate of heat dissipation. In some embodiments, the thermally conductive members 630 encircled by the first dielectric member 420 remain in the liquid state. Under such scenario, the device package 10 is not adhered to the lid 520 through the thermally conductive members 630. In some embodiments, only the first dielectric member 420 formed by the first dielectric pattern 420A (labeled in FIG. 9A) provides the adhesion between the lid 520 and the device package 10.

After coupling the lid 520, the external terminals 320 and the fifth package components 50 are optionally formed on the bottom side 300b of the third package component 300. In some embodiments, the package structure PS4 facilitates the use of liquid metal eutectic alloy as a TIM layer, thereby achieving improved thermal coupling between the device package 10 and the lid 520. The first dielectric member 420 of the package structure PS4 may isolate the respective thermally conductive members 630 and constrain the thermally conductive members 630 to prevent them from spreading. In some embodiments, as the temperature of the semiconductor dies 110 increases due to the package structure PS4 being under operation, the thermally conductive members 630 may remain in the liquid state.

Figure 10:
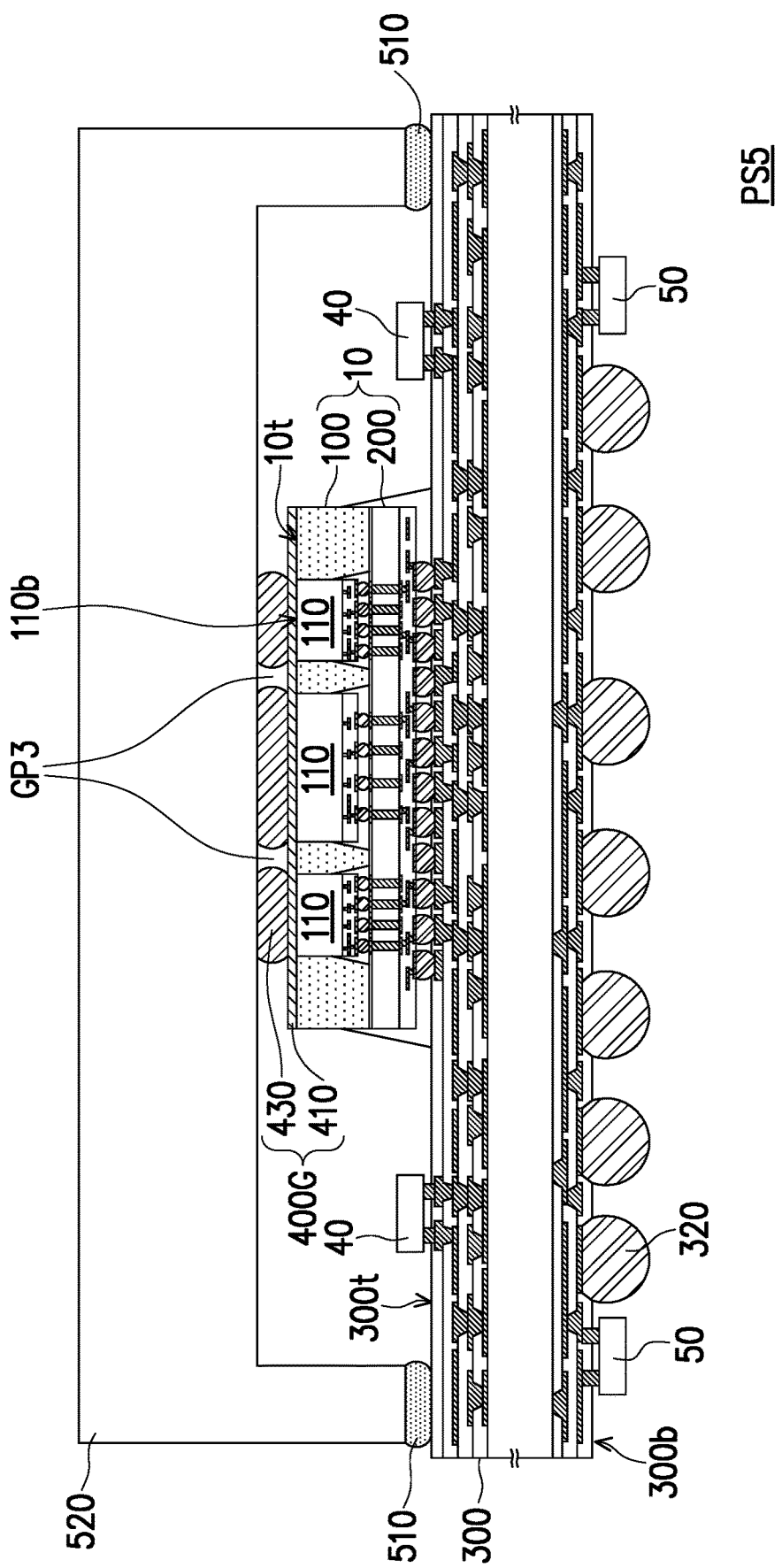
FIG. 10 is a schematic cross-sectional view of a package structure in accordance with some embodiments.

FIG. 10 is a schematic cross-sectional view of a package structure in accordance with some embodiments. A package structure PS5 shown in FIG. 10 may be similar to the package structure PS1 shown in FIG. 1E, the detailed descriptions are not repeated for the sake of brevity, and like reference numbers are used to designate like elements. Referring to FIG. 10 and further referencing FIG. 1E, the difference between the package structure PS5 and the package structure PS1 includes that the configuration of the TIM structure 400G.

In some embodiments, the TIM structure 400G includes the conductive layer 410 and the thermally conductive members 430 disposed thereon, and the TIM structure 400G may be in the absence of the first dielectric member. For example, the thermally conductive members 430 are disposed above the semiconductor dies 110 of the device package 10 with the conductive layer 410 interposed therebetween. The conductive layer 410 may entirely or partially covers the device package 10. For example, the conductive layer 410 extends continuously on the upper surface 10t of the device package 10. Alternatively, the conductive layer extends intermittently on the rear surface (e.g., the second side 110b) of the respective semiconductor die 110. In some other embodiments, the conductive layer covers the intended areas of the upper surface 10t corresponding to hot spot regions on the semiconductor dies 110.

In some embodiments, the respective thermally conductive member 430 has a cross-sectional shape including, but not limited to, an oval, an ellipse, a rectangular with convex curved sides, or other elongated shape. Although the thermally conductive members 430 may have any shape and/or form within the scope of the disclosure. The thermally conductive members 430 may be spatially spaced from one another by a gap GP3. In some embodiments, the gap GP3 is air gap. Alternatively, additional material may be fully or partially filled in the gap GP3 between adjacent thermally conductive members 430 for physically isolation. The thermally conductive members 430 may be employed as discrete members disposed intermittently over the semiconductor dies 110 instead of continuously. In this manner, the thermomechanical stresses between the lid 520 and the device package 10 may be reduced, thereby eliminating delamination and cracking issues.

In accordance with some embodiments, a package structure includes a first package component, a second package component interposed between the first package component and a third package component, a TIM structure overlying the first package component opposite to the second package component, and a heat dissipating component disposed on the third package component and thermally coupled to the first package component through the TIM structure. The first package component includes a plurality of semiconductor dies and an insulating encapsulation encapsulating the semiconductor dies. The semiconductor dies are electrically coupled to the third package component via the second package component. The TIM structure includes a dielectric dam and a plurality of thermally conductive members, the thermally conductive members include a conductive material, and thermally conductive members overlying the semiconductor dies are disposed within areas confined by the dielectric dam.

In accordance with some embodiments, a package structure includes a package substrate, a device package, a TIM structure, and a heat dissipating component disposed on the package substrate and accommodating the device package therein. The device package includes a plurality of semiconductor dies coupled to an interposer and encapsulated by an insulating encapsulation. The package substrate is electrically coupled to the semiconductor dies via the interposer. The TIM structure includes a plurality of thermally conductive members spatially separated from one another and overlying the semiconductor dies. The device package is thermally coupled to the heat dissipating component via the TIM structure.

In accordance with some embodiments, a manufacturing method of a package structure includes at least the following steps. A device package is coupled to a package substrate, where the device package includes a plurality of semiconductor dies encapsulated by an insulating encapsulation and electrically coupled to the package substrate. A first dielectric pattern is formed on the device package opposite to the package substrate, where the first dielectric pattern includes a plurality of openings corresponding to the semiconductor dies of the device package. A thermal conductive material is formed on the semiconductor dies of the device package and in the openings of the first dielectric pattern. A heat dissipating component is placed over the device package and the package substrate, and the heat dissipating component contacts the first dielectric pattern and the thermal conductive material. A thermal treatment process is performed onto the first dielectric pattern and the thermal conductive material to from a TIM structure coupling the heat dissipating component to the device package.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A package structure, comprising:
a first package component comprising a plurality of semiconductor dies and an insulating encapsulation encapsulating the semiconductor dies;
a second package component interposed between the first package component and a third package component, the semiconductor dies being electrically coupled to the third package component via the second package component;

a thermal interface material (TIM) structure overlying the first package component and opposite to the second package component, the TIM structure comprising:
a dielectric dam comprising an outer protrusion and an inner protrusion, the outer protrusion extending beyond a surface of the first package component; and
a plurality of thermally conductive members disposed within areas confined by the dielectric dam, and overlying the semiconductor dies, wherein the inner protrusion of the dielectric dam protrudes toward adjacent one of the thermal conductive members; and
a heat dissipating component disposed on the third package component and thermally coupled to the first package component through the TIM structure.

2. The package structure of claim 1, wherein the TIM structure further comprises:
a conductive layer interposed between the semiconductor dies of the first package component and the thermally conductive members.

3. The package structure of claim 2, wherein the conductive layer separates the thermally conductive members of the TIM structure from the semiconductor dies of the first package component and conforms to an inner sidewall of the dielectric dam adjoining the thermally conductive members.

4. The package structure of claim 1, wherein the thermally conductive members contacting the semiconductor dies of the first package component comprise a viscosity less than a viscosity of the dielectric dam.

5. The package structure of claim 1, wherein the thermally conductive members comprise a solder material or a low-melting eutectic alloy containing tin.

6. The package structure of claim 1, wherein the outer protrusion of the dielectric dam of the TIM structure extends to cover a sidewall of the first package component.

7. The package structure of claim 1, further comprising:
an adhesive member surrounding a stack of the first package component and the second package component and coupling the lid to the third package component, wherein materials of the adhesive member and the dielectric dam of the TIM structure are substantially the same.

8. A package structure, comprising:
a package substrate;
a device package disposed on the package substrate and comprising a plurality of semiconductor dies coupled to an interposer and encapsulated by an insulating encapsulation, the package substrate being electrically coupled to the semiconductor dies via the interposer;
a thermal interface material (TIM) structure disposed on the device package opposite to the package substrate, the TIM structure comprising:
a plurality of thermally conductive members spatially separated from one another and overlying the semiconductor dies; and
a conductive layer interposed between the semiconductor dies and the thermally conductive members;
a dielectric dam overlying the insulating encapsulation of the device package, and the dielectric dam encircling and isolating the thermally conductive members from one another; and
a heat dissipating component disposed on the package substrate and accommodating the device package therein, and the device package being thermally coupled to the heat dissipating component via the TIM structure.

9. The package structure of claim 8, wherein the dielectric dam comprises an outer protrusion extending beyond the conductive layer.

10. The package structure of claim 8, wherein the thermally conductive members of the TIM structure comprise a liquid metal eutectic alloy thermally coupling the heat dissipating component to the semiconductor dies of the device package.

11. The package structure of claim 8, wherein the dielectric dam of the TIM structure comprises a protruding edge extending beyond a surface of the device package facing the heat dissipating component, and an inner sidewall having a curved cross-sectional profile and laterally protruding toward adjacent one of the thermally conductive members.

12. The package structure of claim 8, wherein the thermally conductive members of the TIM structure comprise a solder material metallically bonding the heat dissipating component to the conductive layer of the TIM structure overlying the device package.

13. The package structure of claim 8, further comprising:
an adhesive member intermittently disposed along a perimeter of the package substrate, and the heat dissipating component being bonded to the package substrate through the adhesive member.

14. A package structure, comprising:
a device package comprising semiconductor dies and an insulating encapsulation encapsulating the semiconductor dies;
a heat dissipating component disposed over the device package; and
a thermal interface material (TIM) structure interposed between the device package and the heat dissipating component and thermally coupling the device package with the heat dissipating component, the TIM structure comprising:
discrete conductive members overlying the semiconductor dies in a one-to-one correspondence; and
a dielectric dam comprising a protruding edge extending beyond an edge of the device package and an inner sidewall having a curved cross-sectional profile, and the inner sidewall laterally protruding toward adjacent one of the discrete conductive members, wherein the dielectric dam extends to cover a sidewall of the device package.

15. The package structure of claim 14, wherein the dielectric dam of the TIM structure is in physical contact with a sidewall of the insulating encapsulation.

16. The package structure of claim 14, wherein the discrete conductive members metallically bond the heat dissipating component.

17. The package structure of claim 14, wherein the TIM structure further comprises:
a conductive layer conforming to a curved sidewall and a bottom surface of each of the discrete conductive members.

18. The package structure of claim 17, wherein the conductive layer extends to be interposed between a top surface of the dielectric dam and a bottom surface of the heat dissipating component.

19. The package structure of claim 14, wherein the discrete conductive members of the TIM structure comprises:
a solder material metallically bonding the heat dissipating component to the TIM structure.

20. The package structure of claim 14, further comprising:
a package substrate underlying and electrically coupled to the device package; and an adhesive member intermittently disposed along a perimeter of the package substrate, and the heat dissipating component being bonded to the package substrate through the adhesive member.

* * * * *